United States Patent
Park

(10) Patent No.: US 10,446,217 B2
(45) Date of Patent: Oct. 15, 2019

(54) MEMORY DEVICE AND CONTROL METHOD THEREOF

(71) Applicant: SAMSUNG ELECTRONICS CO., LTD., Suwon-si, Gyeonggi-do (KR)

(72) Inventor: Min-Sang Park, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/988,304

(22) Filed: May 24, 2018

(65) Prior Publication Data

US 2019/0096473 A1    Mar. 28, 2019

(30) Foreign Application Priority Data

Sep. 28, 2017  (KR) .................. 10-2017-0126351

(51) Int. Cl.
  *G11C 11/06* (2006.01)
  *G11C 11/406* (2006.01)
  *G01R 31/28* (2006.01)
  *G11C 7/04* (2006.01)

(52) U.S. Cl.
  CPC .... *G11C 11/40626* (2013.01); *G01R 31/2874* (2013.01); *G11C 7/04* (2013.01); *G11C 11/40615* (2013.01); *G11C 2211/4061* (2013.01); *G11C 2211/4067* (2013.01)

(58) Field of Classification Search
  CPC ....... H01L 2924/00; H01L 2924/12041; H01L 2924/12042; H01L 2924/12043; H01L 2924/13063; H01L 2924/13091; H01L 2924/1461; H01L 2924/15788; H01L 2924/181; H01L 2924/351; G11C 7/12; G11C 29/52; G11C 11/4076; G11C 11/4091; G11C 11/221; G11C 11/4087; G11C 11/419; G11C 29/44; G11C 7/222; G11C 8/10; G11C 11/2273; G11C 11/4093
  USPC ........... 327/512, 101, 138, 147, 83, 128, 72; 257/467; 365/222, 189.05, 200, 230.06
  See application file for complete search history.

(56) References Cited

U.S. PATENT DOCUMENTS

| | | |
|---|---|---|
| 7,359,270 B2 | 4/2008 | Lee |
| 7,412,346 B2 | 8/2008 | Bashir et al. |
| 9,396,787 B2 | 7/2016 | Shoemaker et al. |
| 9,490,003 B2 | 11/2016 | Shoemaker |

(Continued)

FOREIGN PATENT DOCUMENTS

KR    10-1553356    9/2015

OTHER PUBLICATIONS

Official Communication dated Sep. 10, 2018 in Corresponding Application No. SG 10201804165P.

*Primary Examiner* — Thong Q Le
(74) *Attorney, Agent, or Firm* — F. Chau & Associates, LLC

(57) ABSTRACT

A method of controlling a memory device including a temperature sensor includes sensing a temperature of the memory device and extracting an extracted temperature for controlling the memory device using the sensed temperature, storing the extracted temperature in the memory device, calculating an estimated temperature at a current time point using the extracted temperature and a plurality of past extracted temperatures stored in the memory device, and controlling the memory device using the estimated temperature.

20 Claims, 18 Drawing Sheets

(56) References Cited

U.S. PATENT DOCUMENTS

| | | |
|---|---|---|
| 9,640,242 B1 | 5/2017 | Lo et al. |
| 2004/0159904 A1* | 8/2004 | Clabes .................. G01K 7/425 257/467 |
| 2008/0091378 A1 | 4/2008 | Jeong et al. |
| 2010/0292949 A1 | 11/2010 | Van Rijnswou |
| 2012/0224425 A1 | 9/2012 | Fai et al. |
| 2016/0125931 A1 | 5/2016 | Doo et al. |
| 2016/0148905 A1 | 5/2016 | Yu et al. |

* cited by examiner

MEMORY DEVICE AND CONTROL METHOD THEREOF

CROSS-REFERENCE TO RELATED APPLICATION

This application claims priority under 35 U.S.C. § 119 to Korean Patent Application No. 10-2017-0126351, filed on Sep. 28, 2017 in the Korean Intellectual Property Office, the disclosure of which is incorporated by reference herein in its entirety.

TECHNICAL FIELD

Exemplary embodiments of the present inventive concept relate to a memory device, and more particularly, to a method and device for controlling a memory device by processing temperature information.

DISCUSSION OF RELATED ART

Semiconductor memory devices may be classified into volatile memory devices in which stored data is erased when the device is not connected to an electric power supply and nonvolatile memory devices in which stored data is not erased even when the device is disconnected from an electric power supply.

As operational characteristics of semiconductor memory devices vary according to temperature, sensing a temperature of the memory device and controlling the semiconductor memory device based on the sensed temperature may improve the operational characteristics thereof.

SUMMARY

According to an exemplary embodiment of the present inventive concept, a method of controlling a memory device including a temperature sensor includes sensing a temperature of the memory device, and extracting a extracted temperature for controlling the memory device using the sensed temperature, storing the extracted temperature in the memory device, calculating an estimated temperature at a current time point using the extracted temperature and a plurality of past extracted temperatures stored in the memory device, and controlling the memory device using the estimated temperature.

According to an exemplary embodiment of the present inventive concept, a memory device includes at least one memory cell array, a temperature sensor configured to sense a temperature of the memory device, a control logic circuit, and a register. The control logic circuit receives, the sensed temperature from the temperature sensor, generates an extracted temperature of the memory device using the sensed temperature, generates a calibrated temperature using the extracted temperature and a plurality of past extracted temperatures, and controls operations of the at least one memory cell array using the calibrated temperature. The register stores the extracted temperature and the plurality of past extracted temperatures and provides the extract temperature and the plurality of past extracted temperatures stored in the memory device to the control logic circuit.

According to an exemplary embodiment of the present inventive concept, a method of determining a temperature of a memory device includes sensing, by at least one temperature sensor, a temperature of the memory device, extracting the temperature of the memory device using the sensed temperature, generating an estimated temperature at a current time point using the extracted temperature and a plurality of past extracted temperatures stored in the memory device, and determining a calibrated temperature of the memory device using the estimated temperature and the extracted temperature. When the extracted temperature and the estimated temperature over a period of time are plotted in a graph as a plurality of extracted temperatures and a plurality of estimated temperatures, the plurality of extracted temperatures represent a curve that is substantially parallel and shifted in a positive time direction by an extraction delay time on a time axis with respect to a plurality of real temperatures of the memory device, and the plurality of estimated temperatures represent a curve that is closer to the plurality of real temperatures than the plurality of extracted temperatures.

BRIEF DESCRIPTION OF THE DRAWINGS

The above and other features of the present inventive concept will be more clearly understood by describing in detail exemplary embodiments thereof with reference to the accompanying drawings.

DETAILED DESCRIPTION OF THE EMBODIMENTS

Figure 1:
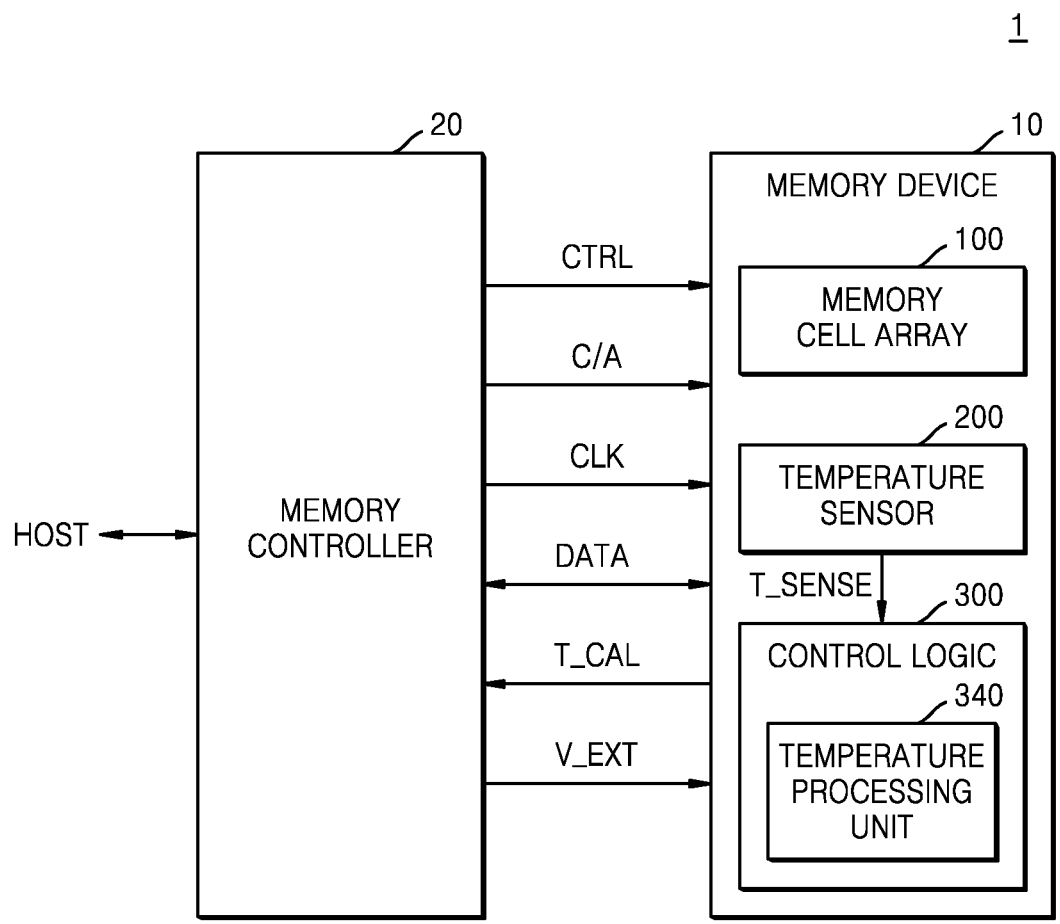
FIG. 1 illustrates a memory system according to an exemplary embodiment of the present inventive concept.

Exemplary embodiments of the present inventive concept provide a method and device for controlling a memory device by reducing instability due to a delay time consumed from a sensing of a temperature of the memory device until controlling of the memory device based on the sensed temperature.

Exemplary embodiments of the present inventive concept will be described more fully hereinafter with reference to the accompanying drawings. Like reference numerals may refer to like elements throughout this application.

FIG. 1 illustrates a memory system according to an exemplary embodiment of the present inventive concept. A memory system 1 may include a memory device 10 and a memory controller 20. The memory system may communicate with a host HOST by using interface protocols such as peripheral component interconnect express (PCI-E), advanced technology attachment (ATA), serial ATA (SATA), parallel ATA (PATA), or serial attached SCSI (SAS). Additionally, the interface protocols between the memory system 1 and the host HOST are not limited to the examples stated above, and for example, may be one of other interface protocols such as universal serial bus (USB), multi-media card (MMC), enhanced small disk interface (ESDI), integrated drive electronics (IDE), etc.

The memory device 10 may include a memory cell array 100, a temperature sensor 200, and a control logic 300. Although FIG. 1 illustrates a case in which the memory device 10 includes only one memory cell array as the memory cell array 100, the memory device 10 is not limited thereto, and for example, the memory device 10 may include two or more memory cell arrays. The memory device 10 may be a semiconductor package including at least one memory chip, or may be a memory module in which a plurality of memory chips are mounted on a module board. For example, the memory device 10 may be implemented by memory modules such as a load reduced dual in-line memory module (LR-DIMM), a registered DIMM (RDIMM), or a nonvolatile dual in-line memory module (NVDIMM).

The memory cell array 100 may include a plurality of word lines, and a plurality of memory cells may be connected to each of the plurality of word lines. The plurality of memory cells may include volatile memory cells, and the memory device 10, as a non-limited example, may be dynamic random access memory (DRAM), static random access memory (SRAM), mobile DRAM, double data rate synchronous dynamic random access memory (DDR SDRAM), lower power DDR (LPDDR), graphic DDR (GDDR), SDRAM, Rambus dynamic access memory (RDRAM), or the like. However, the memory device 10 is not limited thereto, and the plurality of memory cells may also include nonvolatile memory cells. As a non-limited example, the memory device 10 may be electrically erasable programmable read-only memory (EEPROM), flash memory, phase change random access memory (RRAM), nano floating gate memory (NFGM), polymer random access memory (PoRAM), magnetic random access memory (MRAM), ferroelectric random access memory (FRAM), or the like. Hereinafter, the memory device 10 is described as DRAM, but the present inventive concept is not limited thereto.

The temperature sensor 200 may sense the temperature of the memory device 10. Referring to FIG. 1, an example is illustrated in which the memory device 10 includes a single temperature sensor as the temperature sensor 200. However, the present inventive concept is not limited thereto, and the memory device 10 may include, for example, a plurality of temperature sensors.

The control logic 300 may output various internal control signals in the memory device 10, and may generally control various operations in the memory device 10. The control logic 300 may include a temperature processing unit 340. Besides the temperature processing unit 340, the control logic 300 may further include other components to control memory operations, for example, a command decoder or the like. In other words, the control logic 300 may represent various kinds of components, and may be a circuit.

According to an exemplary embodiment of the present inventive concept, the control logic 300 may receive a sensed temperature T_SENSE from the temperature sensor 200, and may also extract a temperature value to be used for controlling the memory device 10 through a series of processes based on the sensing temperatures T_SENSE. The temperature extracted by the control logic 300 may be referred to as an extracted temperature. Since a period of time passes from the sensing of a temperature until the generating of an extracted temperature, the extracted temperature at a certain time point may be different from a real temperature at the certain time point. The control logic 300 may store the extracted temperatures, and the temperature processing unit 340 may process temperature information by using the extracted temperature at the certain time point and a plurality of past extracted temperatures stored in the control logic 300. For example, the temperature processed by the temperature processing unit 340 may be referred to as a calibrated temperature T_CAL and the calibrated temperature T_CAL may be an estimated temperature at the certain time point, which is estimated by using the extracted temperature and the past extracted temperatures. The control logic 300 may also control operations of the memory device 10 by using the calibrated temperature T_CAL, which is generated by processing the extracted temperature, and the memory device 10 may also output the calibrated temperature T_CAL to the outside of the memory device 10.

The memory controller 20 may control the memory device 10 in response to the host HOST's request. For example, the memory controller 20 may control the memory device 10 to write data to or read data from the memory device 10 in response to write/read requests from the host HOST. The memory controller 20 may control writing and reading operations with respect to the memory device 10 by providing a control signal CTRL, a command/address signal C/A, and a clock signal CLK to the memory device 10. As non-limited examples, the memory controller 20 may be integrated with the memory device 10 in one semiconductor package, may be arranged in a single memory module, or may be implemented as a part of the host HOST.

According to an exemplary embodiment of the present inventive concept, the memory controller 20 may receive the calibrated temperature T_CAL from the memory device 10. Based on the calibrated temperature T_CAL, the memory controller 20 may control a cycle (or frequency) of the clock signal CLK transmitted to the memory device 10. Control operations of the memory controller 20 based on the calibrated temperature T_CAL are not limited thereto, and for example, the memory controller 20 may also control an external voltage V_EXT transmitted to the memory device 10, based on the calibrated temperature T_CAL.

Figure 2:
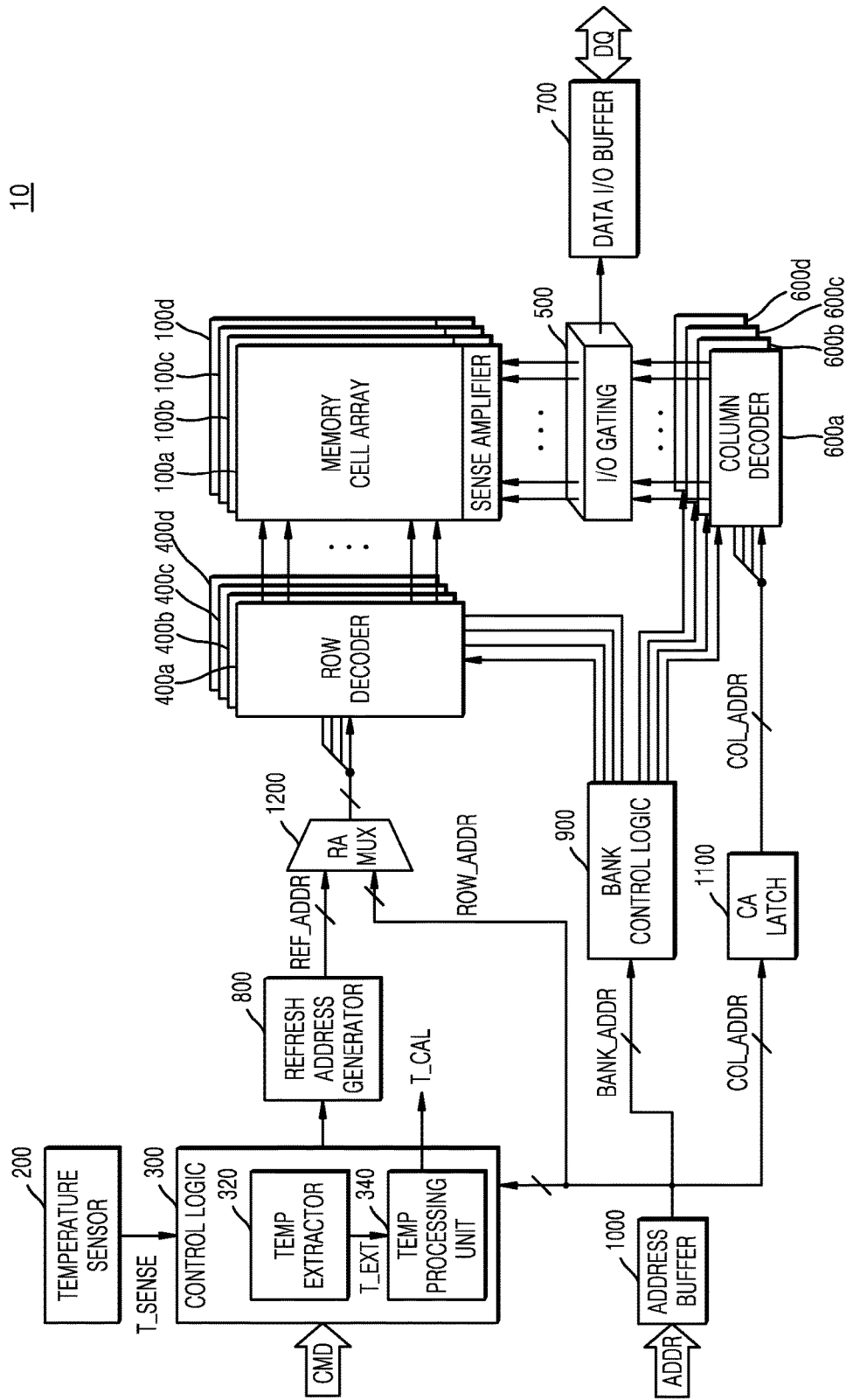
FIG. 2 illustrates a memory device of FIG. 1 according to an exemplary embodiment of the present inventive concept.

FIG. 2 illustrates a memory device of FIG. 1 according to an exemplary embodiment of the present inventive concept. The memory device 10 may include a plurality of memory bank arrays 100a, 100b, 100c, and 100d, the temperature sensor 200, the control logic 300, first through fourth bank row decoders 400a, 400b, 400c, and 400d, an input and output gating circuit 500, first through fourth bank column decoders 600a, 600b, 600c, and 600d, a data input and output buffer 700, a refresh address generator 800, a bank control logic 900, an address buffer 1000, a column address latch 1100, and a row address multiplexer 1200. The refresh address generator 800, the address buffer 1000, and the column address latch 1100 may not be required depending on a configuration of the memory device 10. Although the memory device 10 is described as including the plurality of memory banks, it may be understood that the memory device 10 may include a single memory bank. With respect to the memory device 10, descriptions overlapping with those of FIG. 1 are omitted.

The address buffer 1000 may receive an address including a bank address BANK_ADDR, a row address ROW_ADDR, and a column address COL_ADDR from the memory controller (see 20 in FIG. 1). Additionally, the address buffer 1000 may provide the received bank address BANK_ADDR to the bank control logic 900, provide the received row address ROW_ADDR to the row address multiplexer 1200, and provide the received column address COL_ADDR to the column address latch 1100.

The bank control logic 900 may generate bank control signals in response to the bank address BANK_ADDR. In response to the bank control signals, row decoders in a bank group corresponding to the bank address BANK_ADDRESS from among the first through fourth bank row decoders 400a, 400b, 400c, and 400d may be activated, and the first through fourth bank column decoders 600a, 600b, 600c, and 600d may be activated.

The row address multiplexer 1200 may receive the row address ROW_ADDR from the address buffer 1000 and a refresh row address REF_ADDR from the refresh address generator 800. The row address multiplexer 1200 may selectively output the row address ROW_ADDR or the refresh row address REF_ADDR. The row address ROW_ADDR output from the row address multiplexer 1200 may be applied to the first through fourth bank row decoders 400a, 400b, 400c, and 400d.

From among the first through fourth bank row decoders 400a, 400b, 400c, and 400d, the bank row decoder activated by the bank control logic 900 may decode the row address ROW_ADDR output from the row address multiplexer 1200 and activate a word line corresponding to the decoded row address. For example, the activated bank row decoder may apply a word line drive voltage to the word line corresponding to the decoded row address.

The column address latch 1100 may receive the column address COL_ADDR from the address buffer 1000 and may temporarily store the received column address COL_ADDR. The column address latch 1100 may gradually increase the received column address COL_ADDR under a burst mode. The column address latch 1100 may apply the column address COL_ADDR, which is temporarily stored or gradually increased, to the first through fourth bank column decoders 600a, 600b, 600c, and 600d.

From among the first through fourth bank column decoders 600a, 600b, 600c, and 600d, the bank column decoder activated by the bank control logic 900 may activate a sense amplifier corresponding to the bank address BANK_ADDR and the column address COL_ADDR by using the input and output gating circuit 500.

Beside circuits that gate input and output data, the input and output gating circuit 500 may also include an input data mask logic, read-data latches to store data output from first through fourth memory bank arrays 100a, 100b, 100c, and 100d, and a writing driver to write data on the first through fourth memory bank arrays 100a, 100b, 100c, and 100d.

Data to be written, which will be written on a memory cell array in one memory bank array from among the first through fourth memory bank arrays 100a, 100b, 100c, and 100d, may be provided to the data input and output buffer 700 from the memory controller 20 through a memory buffer. The data provided to the data input and output buffer 700 may be written on one of the memory bank arrays by the writing driver. Data may be transmitted to and from the data input and output buffer 700 via a data bus DQ.

The control logic 300 may include a temperature extractor 320 and a temperature processing unit 340. The temperature extractor 320 may receive the sensing temperatures T_SENSE from the temperature sensor 200. Based on the received sensing temperatures T_SENSE, the temperature extractor 320 may extract a temperature of the memory device 10 to control the memory device 10 and transmit an extracted temperature T_EXT to the temperature processing unit 340. The temperature processing unit 340 may store the extracted temperature T_EXT and generate the calibrated temperature T_CAL by using the extracted temperature T_EXT at a particular time point and past extracted temperatures that are stored in the control logic 300. The control logic 300 may control various operations of the memory device 10 based on the calibrated temperature T_CAL. For example, the control logic 300 may control a refresh cycle of the memory device 10 based on the calibrated temperature T_CAL. For example, when the calibrated temperature T_CAL increases, the refresh cycle may be controlled to have a smaller value. To this end, the control logic 300 may transmit a control signal to the refresh address generator 800 based on the calibrated temperature T_CAL.

The refresh address generator 800 may generate the refresh row address REF_ADDR relevant to a memory cell row in which a refresh operation will be performed. The refresh address generator may generate the refresh row address REF_ADDR based on a refresh cycle which is controlled based on the control signal received from the control logic 300.

According to an exemplary embodiment of the present inventive concept, by estimating a current temperature when generating the calibrated temperature T_CAL by the temperature processing unit 340, instability in controlling the memory device 10 due to an extraction delay time may be reduced.

Figure 3:
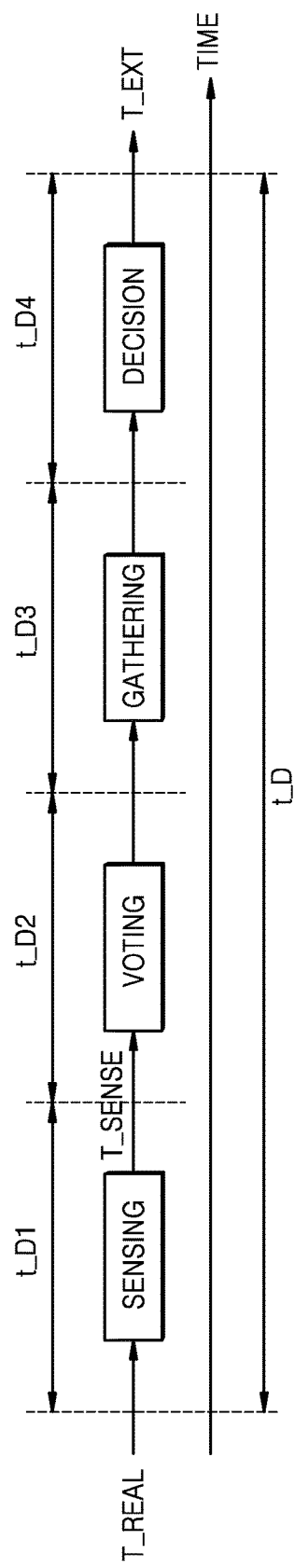
FIG. 3 illustrates a process of temperature extraction performed by the memory device of FIG. 2 according to an exemplary embodiment of the present inventive concept.

FIG. 3 illustrates a process of temperature extraction performed by the memory device of FIG. 2 according to an exemplary embodiment of the present inventive concept. The process of temperature extraction performed by the memory device 10 may include operations of sensing, voting, gathering, and decision. The process of extracting the temperature described in FIG. 3 is one of various examples, processes beside the illustrated processes may be added, and part of the illustrated processes may be omitted.

The operation of sensing may be performed by the temperature sensor (e.g., the temperature sensor 200 of FIG. 1). The temperature sensor may acquire the sensing temperature T_SENSE by performing the operation of sensing a real temperature T_REAL. The memory device (e.g., the memory device 10) may include at least one temperature sensor. For example, when the memory device has a multilayer structure, each layer in the multilayer structure may include a temperature sensor. When the memory device includes a plurality of temperature sensors, the temperature sensors may be in various different positions, and a plurality of sensing temperatures T_SENSE sensed by the temperature sensors may have various different values. A first delay time t_D1 may be consumed in performing the sensing operation.

After the sensing operation, the operations of voting and gathering the sensing temperatures T_SENSE may be performed. For example, when the memory device includes the plurality of temperature sensors, the memory device may perform the operations of voting and gathering on the sensing temperatures T_SENSE to generate a final temperature to control the memory device by using the plurality of sensing temperatures T_SENSE. A second delay time t_D2 may be consumed in the voting operation, and a third delay time t_D3 may be consumed in the gathering operation.

In the decision operation, the memory device may finally determine a temperature of the same by using the gathered temperatures. The memory device may generate the extracted temperature T_EXT by determining the gathered temperatures. A fourth delay time t_D4 may be consumed in the decision operation.

As described above, time may be delayed as much as a sum of the first delay time t_D1, the second delay time t_D2, the third delay time t_D3, and the fourth delay time t_D4 from a point at which a temperature is sensed in the memory device to a point at which the temperature of the memory device is extracted. In this case, a sum of the delay time may be referred to as an extraction delay time t_D. Because the extraction delay time t_D is consumed in generating the extracted temperature T_EXT used for controlling the memory device, the real temperature T_REAL and the extracted temperature T_EXT at a particular time point may be different from each other. Therefore, to more accurately control the memory device, the extracted temperature T_EXT may need calibration.

Figure 4:
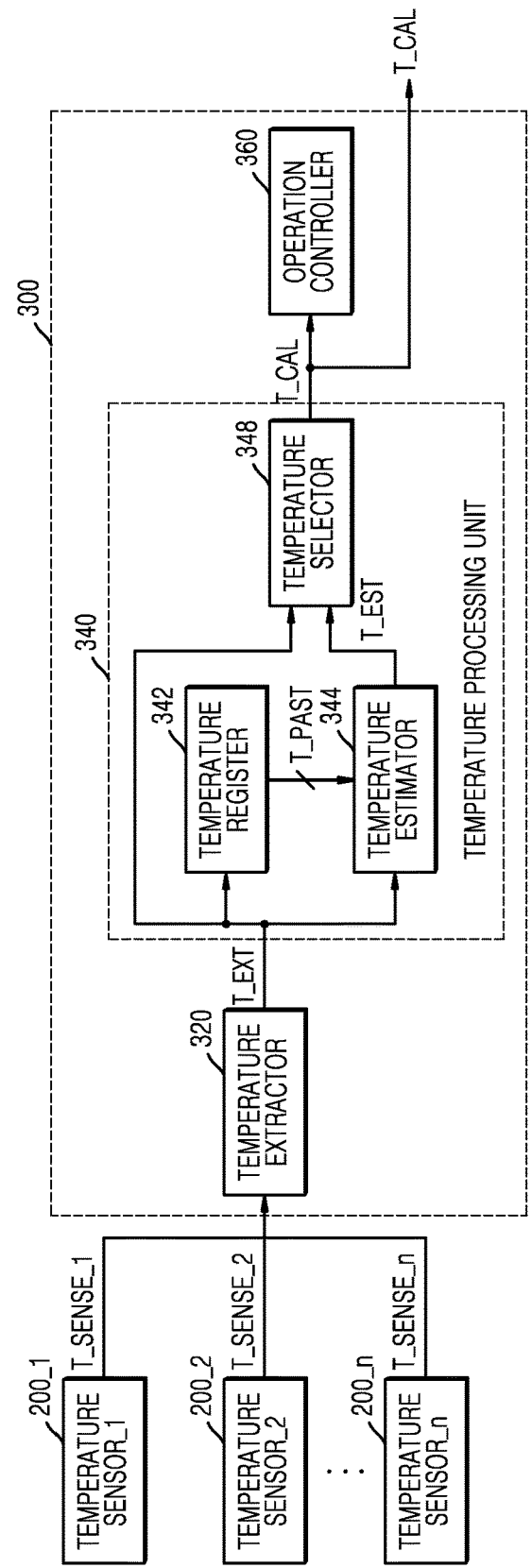
FIG. 4 illustrates a plurality of temperature sensors and a control logic of the memory device of FIG. 1 according to an exemplary embodiment of the present inventive concept.

FIG. 4 illustrates a plurality of temperature sensors and a control logic of the memory device of FIG. 1 according to an exemplary embodiment of the present inventive concept. The memory device 10 may include a plurality of temperature sensors 200_1 through 200_n, where n is a natural number. However, the memory device 10 is not limited to include the plurality of temperature sensors, and it may be understood that the memory device 10 may instead have only one temperature sensor.

The plurality of temperature sensors 200_1 through 200_n may sense temperatures and transmit a plurality of sensing temperatures T_SENSE_1 through T_SENSE_n to the control logic 300. The plurality of temperature sensors 200_1 through 200_n may be in various different positions in the memory device 10, and accordingly, the plurality of sensing temperatures T_SENSE_1 through T_SENSE_n may have various different values.

The control logic 300 may include the temperature extractor 320, the temperature processing unit 340, and an operation controller 360.

The temperature extractor 320 may receive the sensing temperatures T_SENSE_1 through T_SENSE_n from the plurality of temperature sensors 200_1 through 200_n. Through a series of processes illustrated in FIG. 3 as an non-limiting example, the temperature extractor 320 may extract a temperature of the memory device by using the received sensing temperatures T_SENSE_1 through T_SENSE_n. The temperature extractor 320 may generate the extracted temperature T_EXT. The temperature extractor 320 may provide the generated extracted temperature T_EXT to the temperature processing unit 340.

The temperature processing unit 340 may perform an operation of processing the extracted temperature T_EXT received from the temperature extractor 320. The temperature processing unit 340 may include a temperature register 342, a temperature estimator 344, and a temperature selector 348.

The temperature register 342 may store the extracted temperature T_EXT received from the temperature extractor 320. As will be described with reference to FIG. 5, the temperature register 342 may include a plurality of registers to store the extracted temperature T_EXT. At a particular point, a plurality of past extracted temperatures T_PAST stored in the temperature register 342 may be transmitted to the temperature estimator 344. The temperature register 342 may be a separately existing register, or may be a mode register in the control logic 300. In other words, the temperature register 342 may be an arbitrary configuration which may store the extracted temperature T_EXT in the control logic 300. Additionally, even though the temperature register 342 is illustrated as being implemented in the control logic 300, the temperature register 342 may also be an arbitrary configuration which may store values of temperatures in the memory device 10.

The temperature estimator 344 may receive the extracted temperature T_EXT at a current point from the temperature extractor 320, and the plurality of past extracted temperatures T_PAST from the temperature register 342. The temperature estimator 344 may calculate an estimated temperature T_EST at the current point by using the received extracted temperature T_EXT and the plurality of past extracted temperatures T_PAST. For example, the temperature estimator 344 may calibrate a time axis in the negative time direction by the extraction delay time with respect to the extracted temperature T_EXT and the plurality of past extracted temperatures T_PAST, and may also calculate the estimated temperature T_EST at the current point by recognizing tendencies in temperatures according to the passage of time with respect to the extracted temperature T_EXT and the plurality of past extracted temperatures T_PAST on the calibrated time axis. The generating of the estimated temperature T_EST by the temperature estimator 344 will be described in more detail with reference to FIGS. 7A through 14.

The temperature selector 348 may generate the calibrated temperature T_CAL by using the extracted temperature T_EXT received from the temperature extractor 320 and the estimated temperature T_EST received from the temperature estimator 344. For example, the temperature selector 348 may determine a higher temperature between the extracted temperature T_EXT and the estimated temperature T_EST as the calibrated temperature T_CAL. However, the determining of the calibrated temperature T_CAL is not limited thereto, and when the memory device 10 is in a circumstance vulnerable to low temperatures (for example, when the memory device 10 is used in an air conditioning system or a refrigeration system), the temperature selector 348 may determine a lower temperature between the extracted temperature T_EXT and the estimated temperature T_EST as the calibrated temperature T_CAL. Additionally, for example, after determining the higher temperature between the extracted temperature T_EXT and the estimated temperature T_EST as a temporary calibrated temperature, when a change rate of the temporary calibrated temperature is greater than a threshold change rate, the temperature selector 348 may determine the calibrated temperature so that a rate of change in the calibrated temperature T_CAL may be substantially identical to the threshold change rate. The calibrated temperature T_CAL generated by the temperature selector 348 may be transmitted to the operation controller 360, and also to the outside of the memory device 10.

The operation controller 360 may control operations of the memory device 10 based on the calibrated temperature T_CAL received from the temperature processing unit 340. For example, when the calibrated temperature T_CAL increases, the operation controller 360 may control the memory cell array 100 to decrease a refresh cycle. However, the control operations of the operation controller 360 are not limited thereto, and the operation controller 360 may include various control operations. For example, when the calibrated temperature T_CAL increases, the operation controller 360 may control the memory device 10 to decrease an internal voltage.

Figure 5:
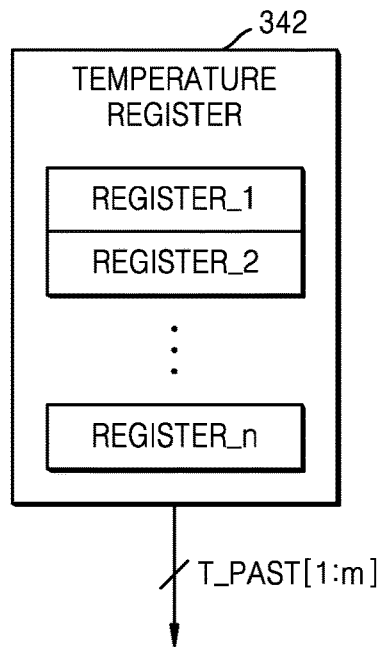
FIG. 5 illustrates a temperature register of FIG. 4 according to an exemplary embodiment of the present inventive concept.

FIG. 5 illustrates a temperature register of FIG. 4 according to an exemplary embodiment of the present inventive concept. Referring to FIGS. 4 and 5, the temperature register 342 may store a value of the extracted temperature T_EXT received from the temperature extractor 320 and may include a plurality of registers REGISTER_1 through REGISTER_n, where n is a natural number. With respect to the temperature register 342, descriptions overlapping with those of FIG. 4 are omitted.

The temperature register 342 may store the extracted temperature T_EXT in the plurality of registers REGISTER_1 through REGISTER_n and may provide m (where m is a natural number) past temperatures T_PAST[1:m] to the temperature estimator 345. In this case, n may have a value identical to a value of m, or may have a value different from the value of m. For example, m may have a value smaller than the value of n. The temperature register 342 may store the extracted temperature T_EXT with extracted time information, or may store the extracted temperature T_EXT at regular time intervals without extra time information.

Figure 6:
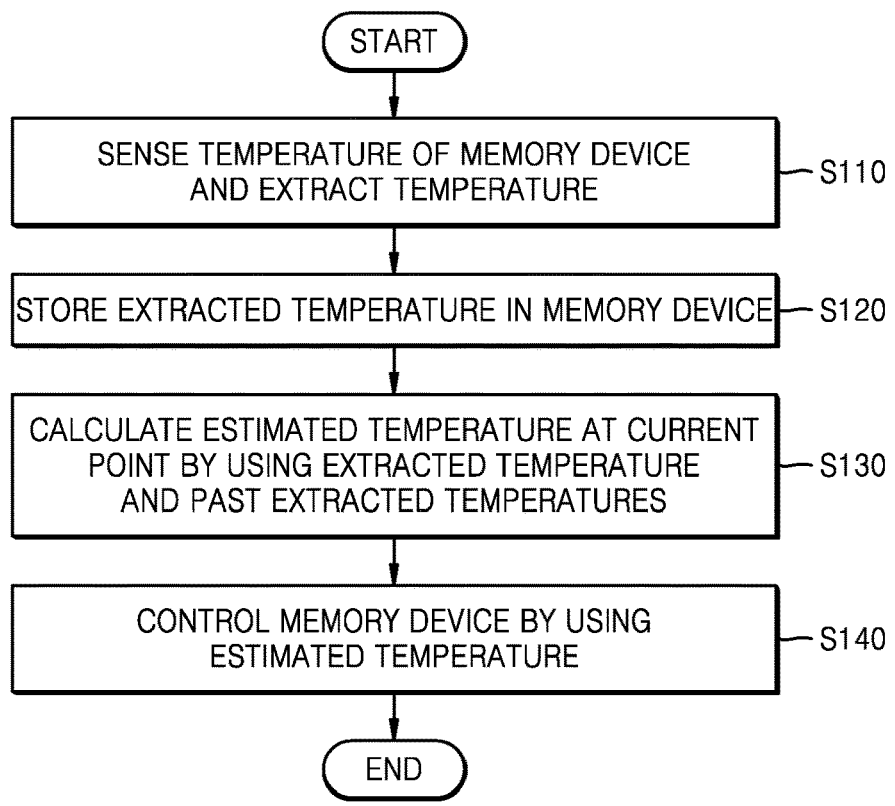
FIG. 6 is a flowchart of controlling a memory device according to an exemplary embodiment of the present inventive concept.

FIG. 6 illustrates a flowchart of controlling a memory device according to an exemplary embodiment of the present inventive concept. The flowchart of FIG. 6 will be described with reference to FIG. 4.

The memory device may sense a temperature of the memory device and extract the temperature of the memory device by using the sensing temperature (S110). For example, the temperature sensors 200_1 through 200_n of the memory device may sense temperatures and generate the sensing temperatures T_SENSE_1 through T_SENSE_n, and may also provide the sensing temperatures T_SENSE_1 through T_SENSE_n to the control logic 300. The temperature extractor 320 included in the control logic 300 may extract a temperature for controlling the memory device based on the sensing temperatures T_SENSE_1 through T_SENSE_n, and generate the extracted temperature T_EXT.

The memory device may store the extracted temperature T_EXT in the memory device (S120). For example, the extracted temperature T_EXT generated by the temperature extractor 320 may be stored in the temperature register 342 included in the temperature processing unit 340 included in the control logic 300. A space in which the extracted temperature T_EXT is stored is not limited to the inside of the control logic 300, and may also be stored in an arbitrary space in the memory device.

The memory device may calculate the estimated temperature T_EST at the current point by using the extracted temperature T_EDT and the past extracted temperatures T_PAST (S130). For example, the temperature estimator 344 may calculate the estimated temperature T_EST of the current point based on the extracted temperature T_EXT received from the temperature extractor 320 and the plurality of past extracted temperatures T_PAST received from the temperature register 342. The temperature estimator 344 may reversely calibrate a time axis by the extraction delay time with respect to the extracted temperature and the plurality of past extracted temperatures T_PAST and determine the estimated temperature T_EST by using the extracted temperature T_EXT and the plurality of past extracted temperatures T_PAST having the calibrated time axis. For example, the temperature estimator 344 may recognize a temperature tendency according to the passage of time with respect to the extracted temperature T_EXT and the plurality of past extracted temperatures T_PAST on the calibrated axis, and may also determine the estimated temperature T_EST by calculating the estimated temperature T_EST corresponding to the current point according to the temperature tendency. For example, the temperature estimator 344 may recognize the temperature tendency according to the passage of time by using a temperature tendency line according to the passage of time for the extracted temperature T_EXT and the plurality of past extracted temperatures T_PAST on the calibrated time axis.

The memory device may control the memory device by using the estimated temperature T_EST (S140). For example, the memory device may determine the calibrated temperature T_CAL by using the extracted temperature T_EXT and the estimated temperature T_EST. For example, the temperature selector 348 may generate the calibrated temperature T_CAL by using the extracted temperature T_EXT received from the temperature extractor 320 and the estimated temperature T_EST received from temperature estimator 344. For example, the temperature selector 348 may determine a higher temperature between the extracted temperature T_EXT and the estimated temperature T_EST as the calibrated temperature T_CAL. However, determining of the calibrated temperature T_CAL is not limited thereto, and for example, in a circumstance where the memory device is vulnerable to lower temperatures, a lower temperature between the extracted temperature T_EXT and the estimated temperature T_EST may be determined as the calibrated temperature T_CAL. Additionally, after determining the higher temperature between the extracted temperature T_EXT and the estimated temperature T_EST as a temporary calibrated temperature, and when a rate of change in the temporary calibrated temperature according to the passage of time is greater than a predetermined threshold change rate, the temperature selector 348 may determine the calibrated temperature T_CAL so that a rate of change in the calibrated temperature T_CAL may be substantially identical to the threshold change rate. The control logic 300 in the memory device may control the memory device based on the calibrated temperature T_CAL. For example, the operation controller 360 included in the control logic 300 may control the operations of the memory device based on the calibrated temperature T_CAL received from the temperature processing unit 340.

Figure 7A:
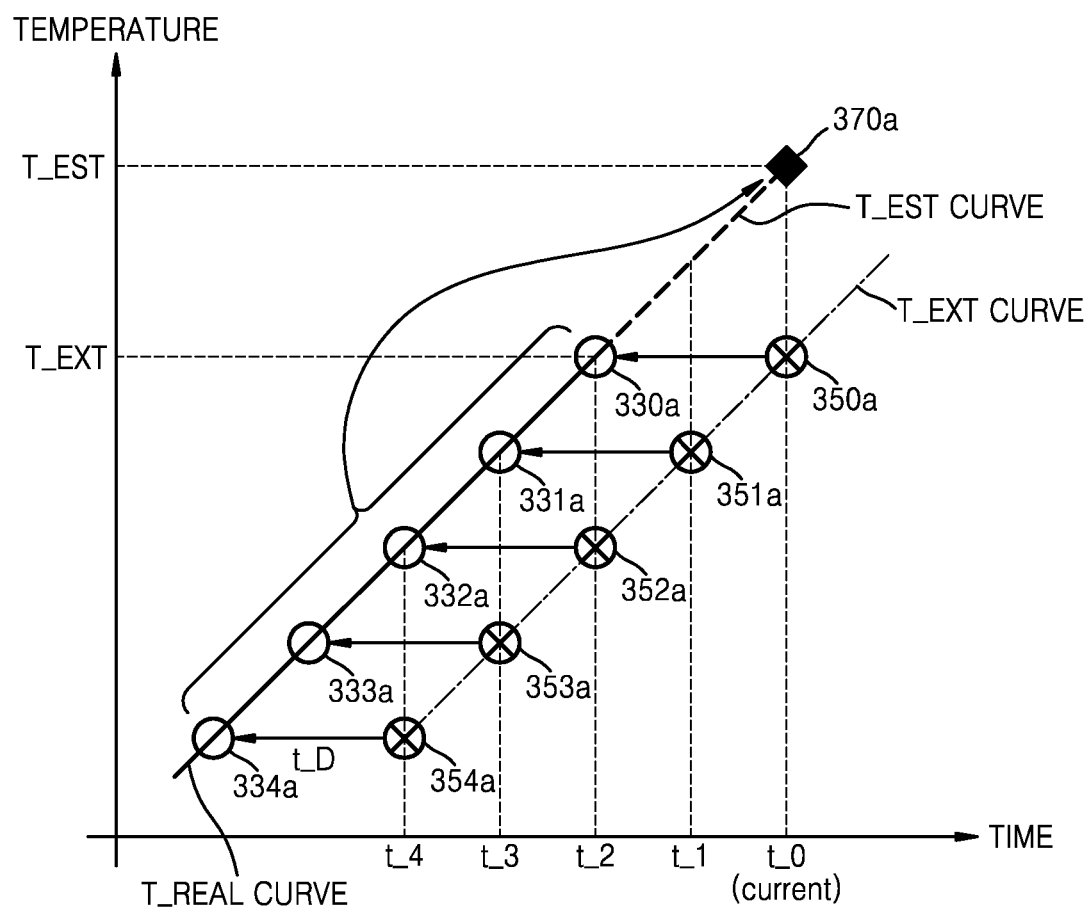
FIGS. 7A and 7B are temperature graphs according to the passage of time according to exemplary embodiments of the present inventive concept.
Figure 7B:
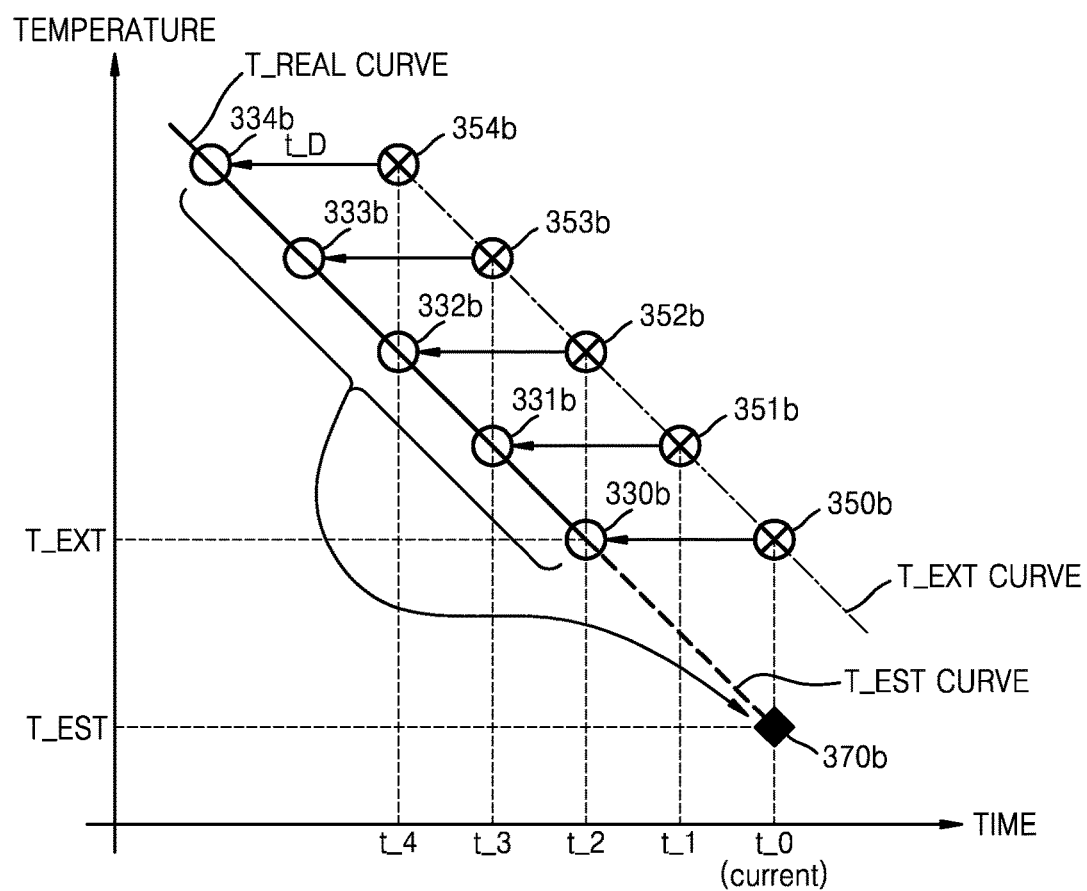

FIGS. 7A and 7B are temperature graphs according to the passage of time according to exemplary embodiments of the present inventive concept. FIG. 7A is a graph of an example in which a temperature of the memory device constantly increases, and FIG. 7B is a graph of an example in which a temperature of the memory device constantly decreases. FIG. 7A may be described with reference to FIG. 4.

Referring to FIG. 7A, in the temperature graph according to the passage of time, a real temperature may constantly increase along a real temperature curve T_REAL CURVE according to the passage of time. As the total extraction delay time t_D is consumed from a point of sensing the temperature to a point of extracting the temperature, an extracted temperature curve T_EXT CURVE may be a graph formed by moving the real temperature curve T_REAL CURVE in parallel in a positive time direction by the extraction delay time on a time axis.

A case in which a current point is t_0 will be described hereinafter. A point on the graph indicating the extracted temperature at the current point t_0 may be referred to as a current extraction point 350a. Extracted temperatures at first through fourth past points t_1 through t_4 stored in the temperature register 342 may be provided to the temperature estimator 344. Points on the graph indicating the temperatures extracted at the first through fourth past points t_1 through t_4 may be referred to as first through fourth past extraction points 351a through 354a. Although four past extracted temperatures are provided to the temperature estimator 344 by the temperature register 342 in FIG. 7A, the number of the past extracted temperatures provided to the temperature estimator 344 is not limited thereto.

The temperature estimator 344 may calibrate the time axis in the negative time direction by the total extraction delay time t_D with respect to the current extraction point 350a and the first through fourth past extraction points 351a through 354a. For example, a current calibration point 330a may be formed by moving the current extraction point 350a in parallel in the negative time direction by the total extraction delay time t_D on the time axis. Additionally, first through fourth past calibration points 331a through 334a may be formed by moving the first through fourth past extraction points 351a through 354a in parallel in the negative time direction by the total extraction delay time t_D on the time axis. The temperature estimator 344 may recognize a tendency in temperatures of the current calibration point 330a and the first through fourth past calibration points 331a through 334a on the calibrated time axis. For example, the temperature estimator 344 may form a tendency line of the current calibration point 330a and the first through fourth past calibration points 331a through 334a on the calibrated time axis. The tendency line may be referred to as an estimated temperature curve T_EST CURVE. As a real temperature T_REAL constantly increases, a real temperature curve T_REAL CURVE may substantially be identical to the estimated temperature curve T_EST CURVE. A point on the graph, which corresponds to the current point t_0 on the estimated temperature curve T_EST CURVE, may be referred to as an estimation point 370a. A temperature at the estimation point 370a may be the estimated temperature T_EST, and as compared with the extracted temperature T_EXT at the current point t_0, may have a value closer to the real temperature T_REAL.

As described above, when the real temperature T_REAL changes, even though the extraction delay time t_D is consumed by the memory device to extract a temperature, a current temperature may be estimated by the operations of the temperature estimator 344. By controlling operations of the memory device with reference to the estimated temperature T_EST, control reliability of the memory device may be improved.

Referring to FIG. 7B, in the temperature graph according to the passage of time, a real temperature may constantly decrease along the real temperature curve T_REAL CURVE according to the passage of time. As the total extraction delay time t_D is consumed from the point of sensing a temperature to the point of extracting the temperature, the extracted temperature curve T_EXT CURVE may be a graph formed by moving the real temperature curve T_REAL CURVE in parallel in the positive time direction by the total extraction delay time t_D on the time axis.

A case in which the current point is t_0 will be described hereinafter. A point on the graph indicating a temperature extracted on the current point t_0 may be referred to as a current extraction point 350b. Extracted temperatures of the first through fourth past points t_1 through t_4 stored in the temperature register 342 may be provided to the temperature estimator 344. Points on the graph indicating the temperatures extracted at the first through fourth past points may be referred to as first through fourth past extraction points 351b through 354b. Although four past extracted temperatures are provided to the temperature estimator 344 by the temperature register 342 in FIG. 7B, the number of the past extracted temperatures provided to the temperature estimator 344 is not limited thereto.

The temperature estimator 344 may calibrate the time axis in a negative time direction by the extraction delay time t_D with respect to the current extraction point 350b and the first through fourth past extraction points 351b through 354b. For example, a current calibration point 330b may be formed by moving the current extraction point 350b in parallel in a negative time direction by the extraction delay time t_D on the time axis. Additionally, first through fourth past calibration points 331b through 334b may be formed by moving the first through fourth past extraction points 351b through 354b in parallel in a negative time direction by the extraction delay time t_D on the time axis. The temperature estimator 344 may recognize a temperature tendency of the current calibration point 330b and the first through fourth past calibration points 331b through 334b each having a calibrated time axis. For example, the temperature estimator 344 may form a tendency line of the current calibration point 330b and the first through fourth past calibration points 331b through 334b having the calibrated time axis. The tendency line may be referred to as the estimated temperature curve T_EST CURVE. As the real temperature constantly decreases, the real temperature curve T_REAL CURVE and the estimated temperature curve T_EST CURVE may be substantially equal. A point on the graph, which corresponds to the current point on the estimated temperature curve T_EST CURVE, may be referred to as an estimation point 370b. A temperature at the estimation point 370b may be the estimated temperature T_EST, and as compared with the extracted temperature T_EXT at the current point t_0, may have a value closer to the real temperature T_REAL.

As described above, when the real temperature T_REAL changes, even though the extraction delay time t_D is consumed by the memory device to extract a temperature, a current temperature may be estimated by the operations of the temperature estimator 344. By controlling operations of the memory device with reference to the estimated temperature T_EST, the control reliability of the memory device may be improved.

Referring to FIGS. 7A and 7B, when the temperatures constantly increase or decrease according to the passage of time, the real temperature curve T_REAL CURVE and the estimated temperature curve T_EST CURVE may be almost identical, and accordingly, the operations of the memory device may be controlled based on a temperature closer to the real temperature T_REAL.

Figure 8A:
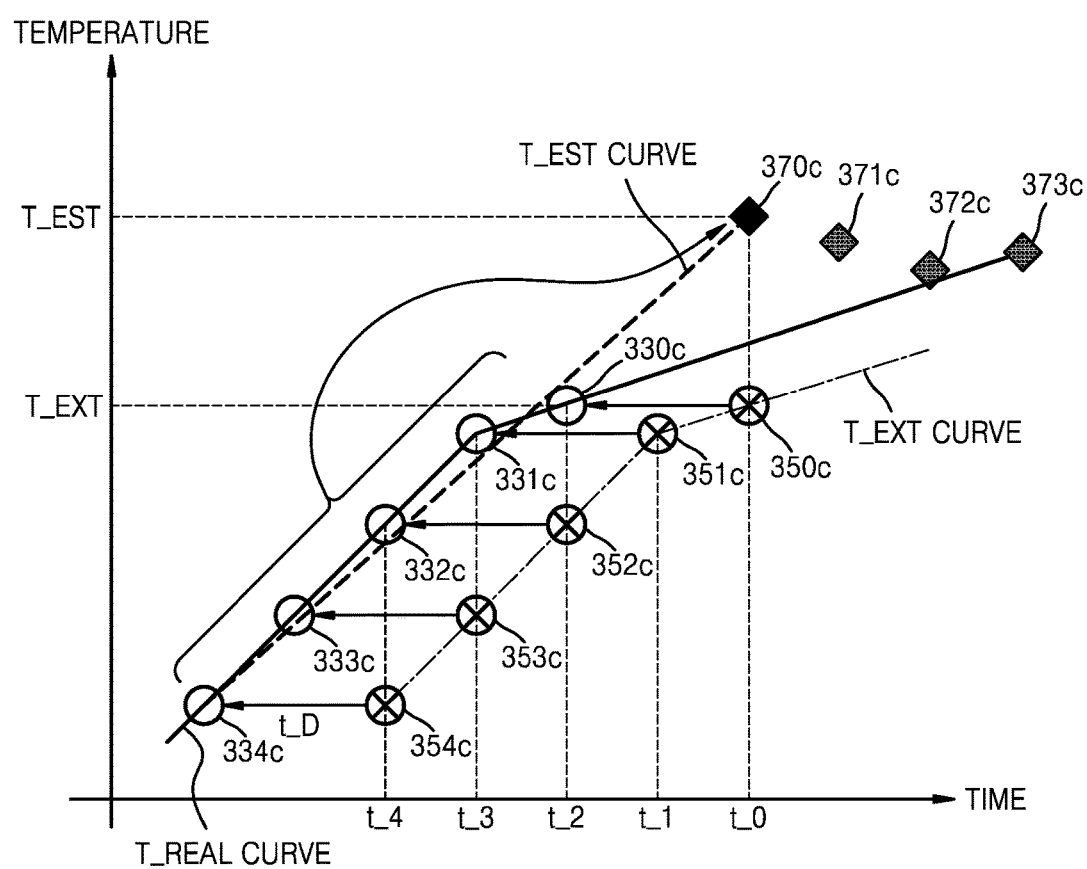
FIGS. 8A and 8B are temperature graphs according to the passage of time according to exemplary embodiments of the present inventive concept.
Figure 8B:
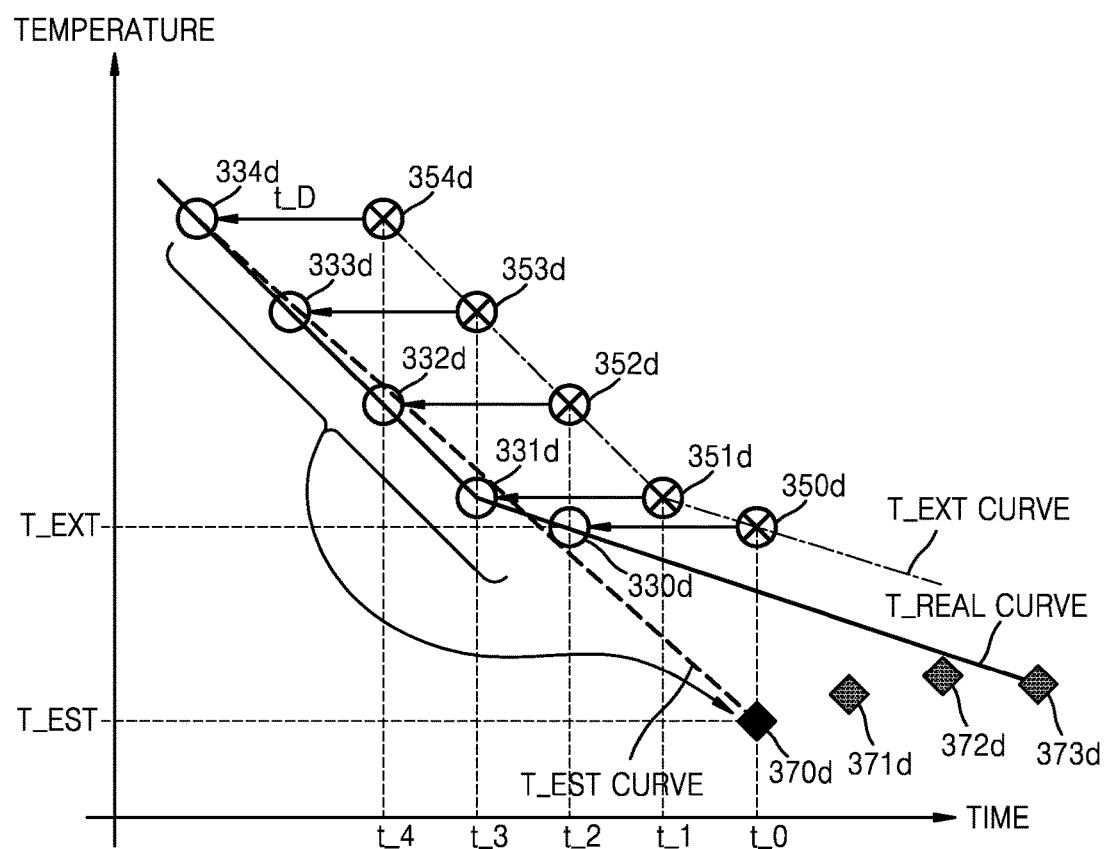

FIGS. 8A and 8B are temperature graphs according to the passage of time according to exemplary embodiments of the present inventive concept. FIG. 8A illustrates an example in which an increase rate of the temperature of the memory device decreases, and FIG. 8B illustrates an example in which a decrease rate of the temperature of the memory device decreases. FIGS. 8A and 8B may be described with reference to FIG. 4.

Referring to FIG. 8A, on the temperature graph according to the passage of time, a real temperature increases constantly along with the real temperature curve T_REAL CURVE according to the passage of time, and then, an increase rate of the real temperature may decrease. Like in FIG. 7A, the extracted temperature curve T_EXT CURVE may be a graph formed by moving the real temperature curve T_REAL CURVE in parallel in the positive time direction by the total extraction delay time t_D on a time axis.

A case in which the current point is t_0 will be described hereinafter, and descriptions overlapping with those of FIGS. 7A and 7B with respect to a current extraction point 350c, first through fourth past extraction points 351c through 354c, a current calibration point 330c, and first through fourth past calibration points 331c through 334c may be omitted.

The temperature estimator 344 may recognize a tendency in the temperatures by forming a tendency line of the current calibration point 330c and the first through fourth past calibration points 331c through 334c. The tendency line may be referred to as the estimated temperature curve T_EST CURVE. Due to a change in a temperature increase rate, the estimated temperature curve T_EST CURVE may be different from the real temperature curve T_REAL CURVE. A point on the graph corresponding to the current point on the estimated temperature curve T_EST CURVE may be referred to as an estimation point 370c, and a temperature at the estimation point 370c may be the estimated temperature T_EST. In this case, unlike in FIGS. 7A and 7B, the estimated temperature T_EST may have a value different from a value of the real temperature T_REAL. However, it is a temporal difference occurring in a section where the temperature increase rate change, and estimation points 371c, 372c, and 373c may be illustrated on a graph close to the real temperature curve T_REAL CURVE. Additionally, considering that the estimated temperature T_EST may have the value different from the value of the real temperature T_REAL, the temperature selector 348 in the temperature processing unit 340 may determine a more appropriate value between the estimated temperature T_EST and the extracted temperature T_EXT as the calibrated temperature T_CAL.

As described above, when the real temperature changes, the estimated temperature T_EST may be determined by the operations of the temperature estimator 344 even though the total extraction delay time t_D is consumed for the memory device to extract the temperature, and by controlling the operations of the memory device with reference to the estimated temperature T_EST, control reliability of the memory device may be improved.

Referring to FIG. 8B, on the temperature graph according to the passage of time, a real temperature decreases constantly along with a real temperature curve T_REAL CURVE according to the passage of time, and then, a decrease rate of the real temperature may decrease. Like in FIG. 7A, the extracted temperature curve T_EXT CURVE may be a graph formed by moving the real temperature curve T_REAL CURVE in parallel in the positive time direction by the total extraction delay time t_D on a time axis.

A case in which the current point is t_0 will be described hereinafter, and descriptions overlapping with those of FIGS. 7A and 7B, with respect to a current extraction point 350d, first through fourth past extraction points 351d through 354d, a current calibration point 330d, and first through fourth past calibration point 331d through 334d are omitted.

The temperature estimator 344 may recognize a temperature tendency by forming tendency lines of the current calibration point 330d and the first through fourth past calibration points 331d through 334d. The tendency line may be referred to as the estimated temperature curve T_EST CURVE. Due to change in a temperature decrease rate, the estimated temperature curve T_EST CURVE may be different from the real temperature curve T_REAL CURVE. A point on the graph corresponding to the current point on the estimated temperature curve T_EST CURVE may be referred to as an estimation point 370d, and a temperature at the estimation point 370d may be the estimated temperature T_EST. In this case, the estimated temperature T_EST may be different from the real temperature T_REAL. However, it is a temporal difference occurring in a section in which a temperature decrease rate changes, and estimation points 371d, 372d, and 373d may be illustrated on a graph close to the real temperature curve T_REAL CURVE. Additionally, considering that the estimated temperature T_EST may have a value different from a value of the real temperature T_REAL, the temperature selector 348 in the temperature processing unit 340 may determine a more appropriate value between the estimated temperature T_EST and the extracted temperature T_EXT as the calibrated temperature T_CAL.

As described above, when the real temperature changes, the estimated temperature T_EST may be determined by the operations of the temperature estimator 344 even though the total extraction delay time t_D is consumed for the memory device to extract the temperature, the control reliability of the memory device may be improved by controlling the operations of the memory device with reference to the estimated temperature T_EST.

Figure 9:
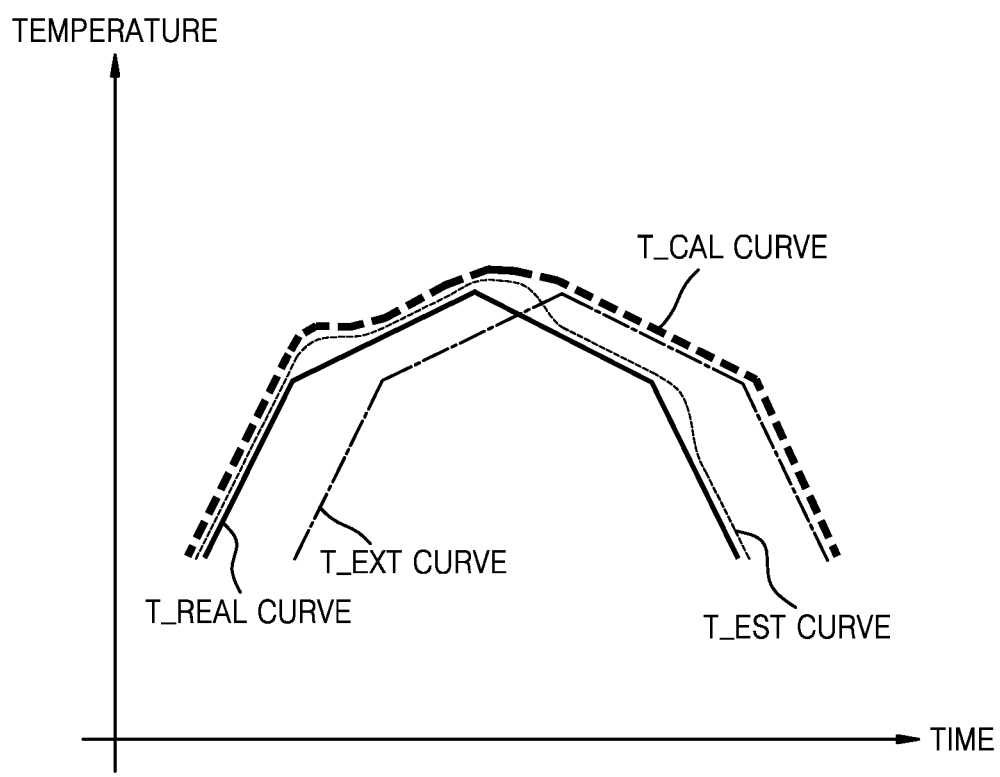
FIG. 9 illustrates a temperature graph according to the passage of time according to an exemplary embodiment of the present inventive concept.

FIG. 9 illustrates a temperature graph according to the passage of time according to an exemplary embodiment of the present inventive concept. FIG. 9 may illustrate the real temperature curve T_REAL CURVE, the extracted temperature curve T_EXT CURVE, the estimated temperature curve T_EST CURVE, and a calibrated temperature curve T_CAL CURVE according to the passage of time. FIG. 9 may be described with reference to FIG. 4.

The extracted temperature curve T_EXT may be a graph formed by moving the real temperature curve T_REAL CURVE in parallel in the positive time direction by the total extraction delay time t_D on a time axis. The temperature estimator 344 may determine the estimated temperature T_EST by calibrating the time axis in the negative time direction by the total extraction delay time t_D with respect to points on the extracted temperature curve T_EXT CURVE, thus determining the estimated temperature curve T_EST CURVE. Although the estimated temperature curve T_EST CURVE may be, in general, substantially identical to the real temperature curve T_REAL CURVE, in a section where a slope of the real temperature curve T_REAL CURVE changes, a little gap may be generated between the estimated temperature curve T_EST CURVE and the real temperature curve T_REAL CURVE.

The temperature selector 348 may receive the extracted temperature T_EXT and the estimated temperature T_EST at the current point. As many memory devices are vulnerable to high temperatures, in consideration of a worst case, the temperature selector 348 may determine a higher temperature between the extracted temperature T_EXT and the estimated temperature T_EST as the calibrated temperature T_CAL. However, operations of the temperature selector 348 are not limited thereto, and under a condition where the memory device is vulnerable to low temperatures, the temperature selector 348 may select a lower temperature between the extracted temperature T_EXT and the estimated temperature T_EST as the calibrated temperature T_CAL, which will be described with reference to FIG. 14. According to the operations of the temperature selector 348, the calibrated temperature curve T_CAL CURVE may form a curve to have a higher temperature value between the extracted temperature curve T_EXT CURVE and the estimated temperature curve T_EST CURVE.

As described above, the memory device may be controlled based on a higher temperature among current estimated temperatures estimated by using the temperature information extracted at the current point and the plurality of past extracted temperatures, and thus, control security and actions of the memory device may be improved.

Figure 10:
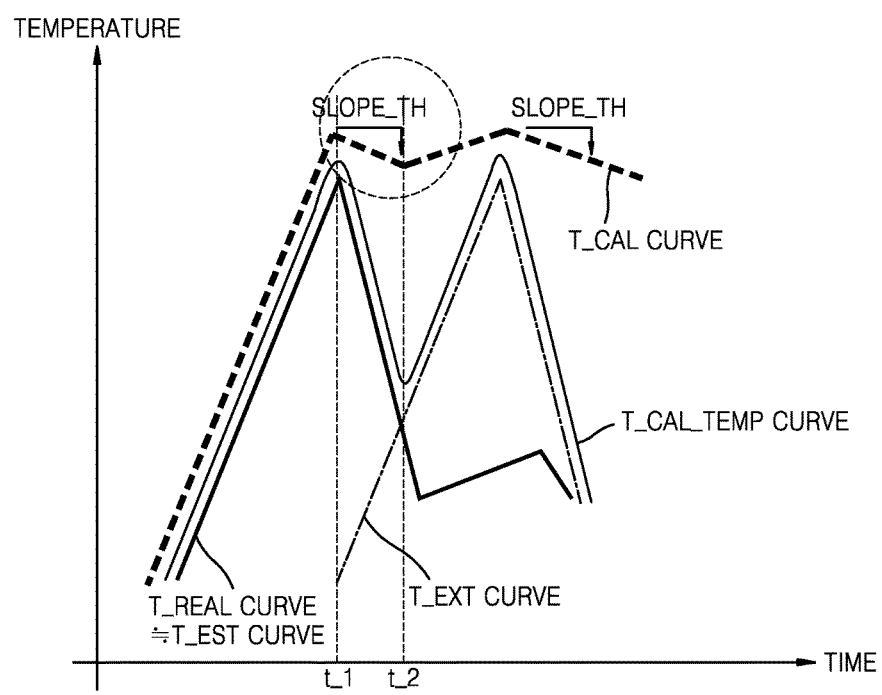
FIG. 10 illustrates a temperature graph according to the passage of time according to an exemplary embodiment of the present inventive concept.

FIG. 10 illustrates a temperature graph according to the passage of time according to an exemplary embodiment of the present inventive concept. FIG. 10 is a graph of a case in which temperatures change rapidly according to the passage of time. FIG. 10 may be described with reference to FIG. 4.

The real temperature T_REAL may rapidly change along with the real temperature curve T_REAL CURVE, and the extracted temperature curve T_EXT CURVE, which indicates the extracted temperature T_EXT extracted by the memory device after sensing, may be a graph formed by moving the real temperature curve T_REAL CURVE in parallel in the positive time direction by the total extraction delay time on a time axis. As described with reference to FIGS. 7A through 9, the temperature estimator 344 may calculate the estimated temperature T_EST of the current point by moving the extracted temperature curve T_EXT CURVE in parallel in the negative time direction by the total extraction delay time on the time axis. Although the estimated temperature curve T_EST CURVE may be a little different from the real temperature curve T_REAL CURVE in a section where a slope of the real temperature curve T_REAL CURVE changes, for convenience of explanation, the estimated temperature curve T_EST CURVE is described as being substantially identical to the real temperature curve T_REAL CURVE.

The temperature selector 348 may select a higher value between the extracted temperature T_EXT and the estimated temperature T_EST. The temperature selector 348 may determine a higher temperature between the extracted temperature T_EXT and the estimated temperature T_EST as the calibrated temperature T_CAL. Additionally, the temperature selector 348 may determine a higher value between the extracted temperature T_EXT and the estimated temperature T_EST as a temporary calibrated temperature, and when a rate of change in the temporary calibrated temperature according to the passage of time is higher than a predetermined threshold change rate, the temperature selector 348 may determine the calibrated temperature T_CAL so that a rate of change in the calibrated temperature T_CAL may be substantially identical to the threshold change rate. The temporary calibrated temperature determined by the temperature selector 348, along with a temporary calibrated temperature curve T_CAL_TEMP CURVE, may be illustrated in a graph that selects a larger value between the estimated temperature curve T_EST CURVE and the extracted temperature curve T_EXT_CURVE. As a rate of change in the temporary calibrated temperature curve T_CAL TEMP CURVE is higher than a threshold change rate SLOPE_TH between a first point t_1 and a second point t_2, the temperature selector 348 may determine the calibrated temperature T_CAL so that a rate of change in the calibrated temperature curve T_CAL CURVE may be substantially identical to the threshold change rate SLOPE_TH.

As described above, even when the temperatures rapidly change, the memory device may be stably controlled by limiting a rate of change in the calibrated temperature T_CAL, which is used for controlling the memory device, as the threshold change rate SLOPE_TH.

Figure 11:
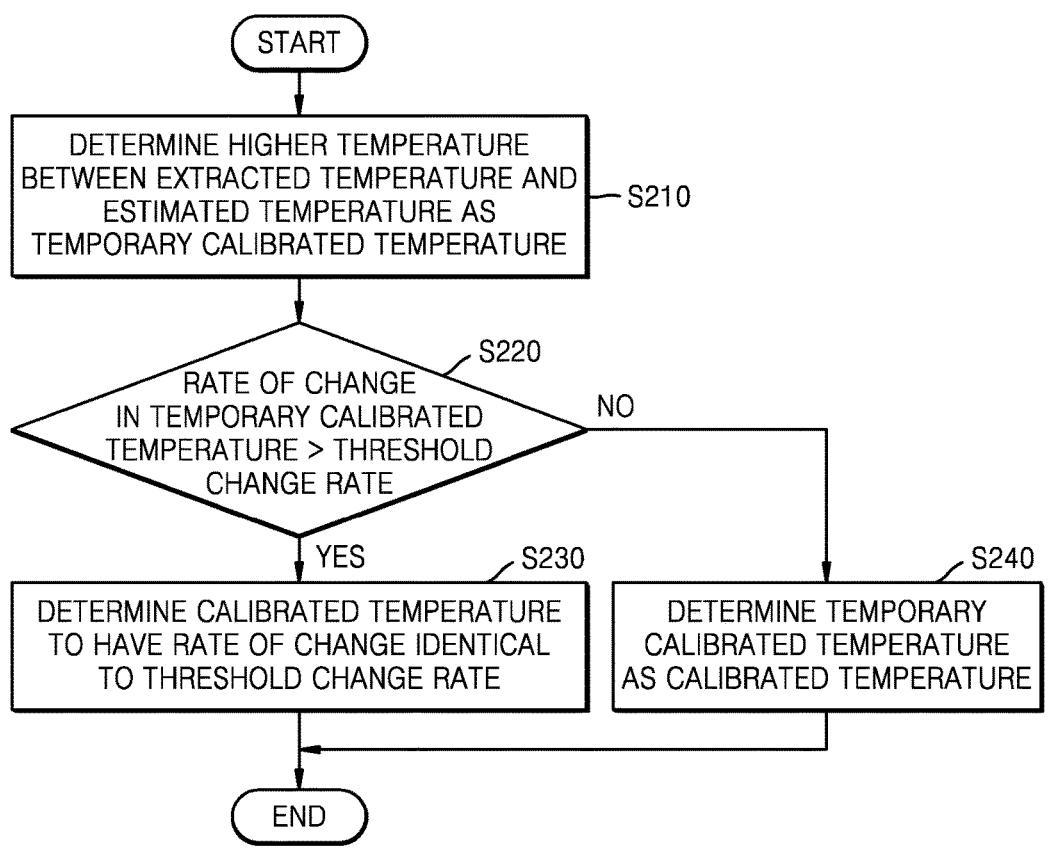
FIG. 11 is a flowchart of a temperature change rate limitation sequence according to an exemplary embodiment of the present inventive concept.

FIG. 11 is a flowchart of a temperature change rate limitation sequence according to an exemplary embodiment of the present inventive concept.

Referring to FIG. 4, the temperature selector 348 may receive the extracted temperature T_EXT from the temperature extractor 320 and receive the estimated temperature T_EST from the temperature estimator 344. The temperature selector 348 may determine a higher temperature between the extracted temperature T_EXT and the estimated temperature T_EST as a temporary calibrated temperature (S210). The temperature selector 348 may receive a value of a rate of change in the temporary calibrated temperature from another logic in the temperature processing unit 340, or may also directly calculate the value of the rate of change in the temporary calibrated temperature.

The temperature selector 348 may compare the value of the rate of change in the temporary calibrated temperature and a value of a threshold change rate (S220). When the rate of change in the temporary calibrated temperature is higher than the threshold change rate, the temperature selector 348 may determine the calibrated temperature T_CAL so that a rate of change in the calibrated temperature T_CAL may be substantially identical to the threshold change rate (S230). On the other hand, when the rate of change in the temporary calibrated temperature is less than or equal to the threshold change rate, the temperature selector 348 may determine the temporary calibrated temperature as the calibrated temperature (S240).

As described above, the memory device may be more stably controlled by limiting the rate of change in the calibrated temperature T_CAL, which is used for controlling the memory device, to a threshold change rate.

Figure 12:
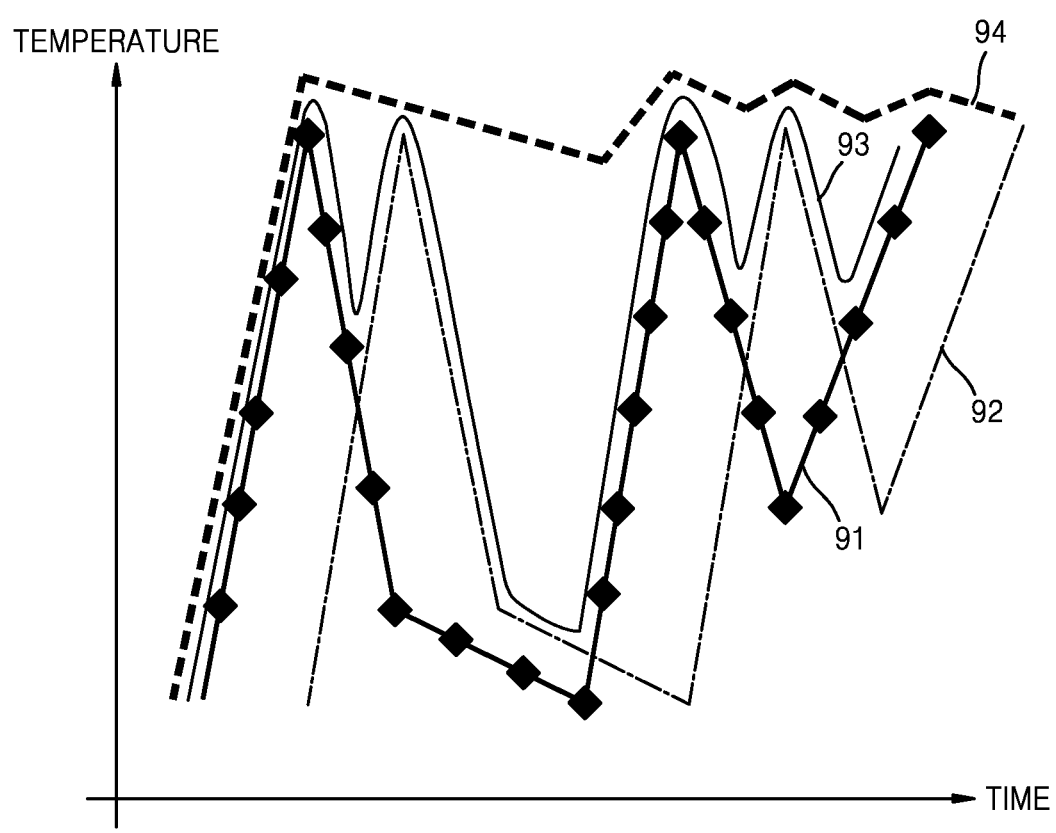
FIG. 12 illustrates a temperature graph according to the passage of time according to an exemplary embodiment of the present inventive concept.

FIG. 12 illustrates a temperature graph according to the passage of time according to an exemplary embodiment of the present inventive concept. FIG. 12 may be described with reference to FIG. 4.

The real temperature T_REAL, according to the passage of time, changes along with a real temperature curve 91, and compared to the real temperature curve 91, an extracted temperature curve 92 may be illustrated as a graph which is delayed by the extraction delay time on a time axis. The temperature estimator 344 in the temperature processing unit 340, after moving the extracted temperature curve 92 in parallel in the negative time direction by the extraction delay time, may determine the estimated temperature T_EST of the current point by recognizing a tendency of the curve moved in parallel. Although the estimated temperature curve may be a little different from the real temperature curve 91, when the temperature does not change precipitously, the estimated temperature curve is substantially identical to the real temperature curve 91, hence, the real temperature curve 91 may correspond to the estimated temperature curve. The temperature selector 348 may determine a temporary calibrated temperature based on the estimated temperature T_EST and the extracted temperature T_EXT. For example, the temperature selector 348 may determine a higher temperature between the estimated temperature T_EST and the extracted temperature T_EXT as the temporary calibrated temperature. Accordingly, a temporary calibrated temperature curve 93 may be a graph illustrated by following higher temperatures between the estimated temperature curve and the extracted temperature curve 92. When a rate of change in the temporary calibrated temperature curve 93 is higher than a threshold rate, the temperature selector 348 may determine a calibrated temperature so that a rate of change in the calibrated temperature may be substantially identical to the threshold change rate. Accordingly, compared to the temporary calibrated temperature curve 93, a rate of change with time may be lower in a calibrated temperature curve 94. As the calibrated temperature in the calibrated temperature curve 94 is used for controlling the memory device, the memory device may be controlled with more stability.

Figure 13:
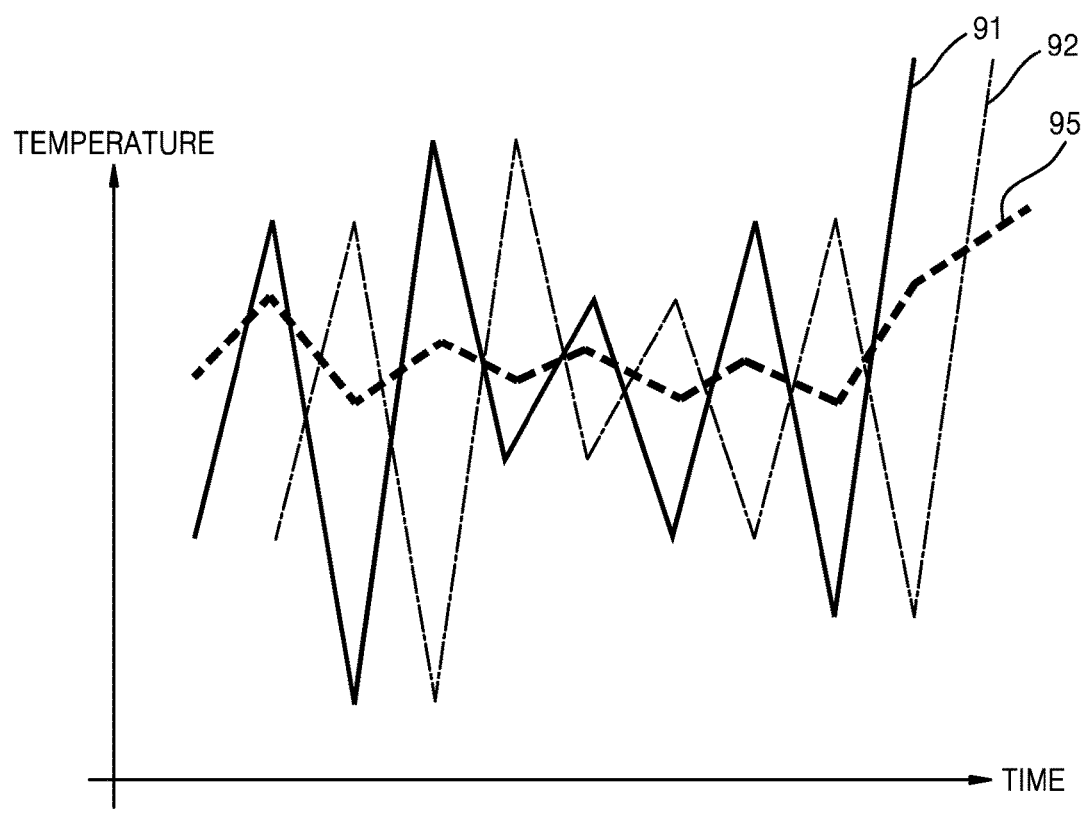
FIG. 13 illustrates a temperature graph according to the passage of time according to an exemplary embodiment of the present inventive concept.

FIG. 13 illustrates a temperature graph according to the passage of time according to an exemplary embodiment of the present inventive concept. FIG. 13 may be described with reference to FIG. 4.

A real temperature may be illustrated in a graph with a rapid temperature change along with the real temperature curve 91. The extracted temperature curve 92 may be a graph formed by moving the real temperature curve 91 in parallel in the positive time direction by the total extraction delay time on a time axis. The temperature estimator 344 in the temperature processing unit 340, after moving the extracted temperature curve 92 in parallel in the negative time direction by the total extraction delay time, may determine the estimated temperature T_EST of the current point by recognizing a tendency of the curve moved in parallel. Although the estimated temperature curve may be a little different from the real temperature curve, when the temperature does not change precipitously, the estimated temperature curve is substantially identical to the real temperature curve, hence, the real temperature curve 91 may correspond to the estimated temperature curve. In an exemplary embodiment of the present inventive concept, the temperature processing unit 340 may acquire a section average temperature by calculating an average of a particular section with respect to the estimated temperature curve. A section average temperature curve 95 may be a graph following a section average of the estimated temperature curve. As needed, the temperature selector 348 may determine the section average temperature as the calibrated temperature T_CAL. For example, when the temperature rapidly changes, the temperature selector 348 may determine the section average temperature as the calibrated temperature. In this case, the calibrated temperature curve may be substantially identical to the section average temperature curve 95.

Figure 14:
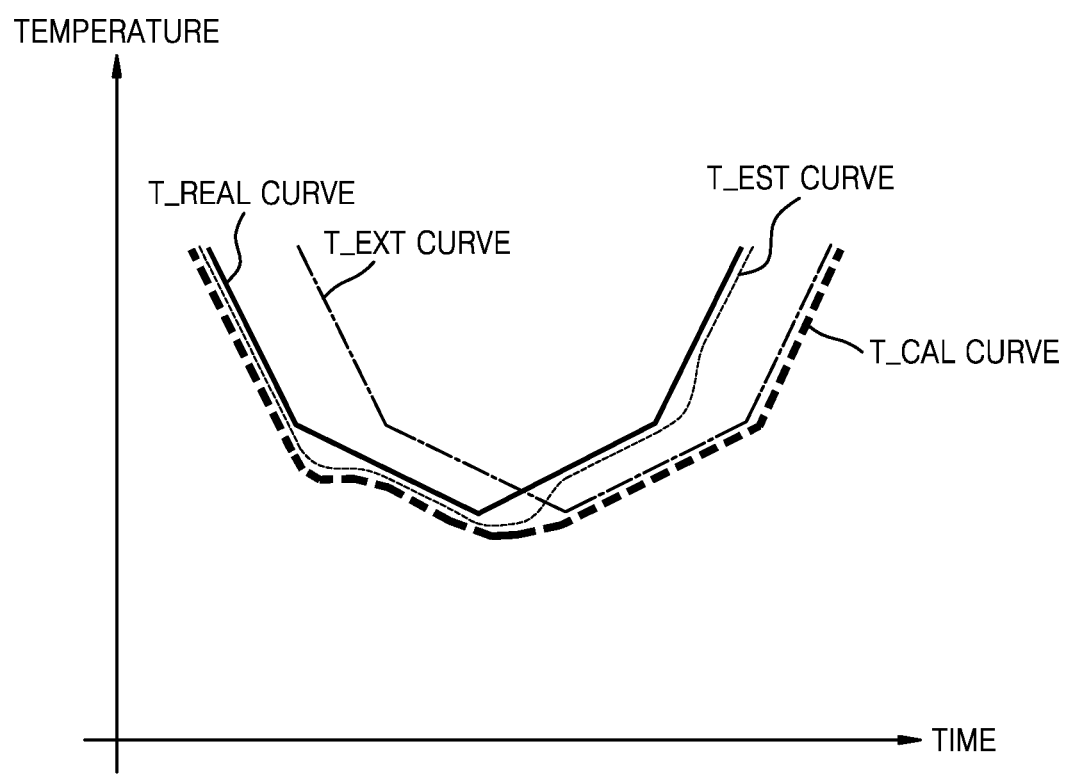
FIG. 14 illustrates a temperature graph according to the passage of time according to an exemplary embodiment of the present inventive concept.

FIG. 14 is a temperature graph according to the passage of time according to an exemplary embodiment of the present inventive concept. FIG. 14 may illustrate the real temperature curve T_REAL CURVE, the extracted temperature curve T_EXT CURVE, the estimated temperature curve T_EST, and the calibrated temperature curve T_CAL_CURVE. FIG. 14 may be described with reference to FIG. 4.

The extracted temperature curve T_EXT CURVE may be a graph formed by moving the real temperature curve T_REAL CURVE in parallel in a positive time direction by the extraction delay time t_D on the time axis. The temperature estimator 344 may determine the estimated temperature T_EST by calibrating the time axis in the negative time direction by the total extraction delay time with respect to points on the extracted temperature curve T_EXT CURVE and recognizing their tendency, and thus, the estimated temperature curve T_EST CURVE may be determined. Although the estimated temperature curve T_EST CURVE may be, in general, substantially identical to the real temperature curve T_REAL CURVE, in a section where a slope of the real temperature curve T_REAL CURVE changes, a little gap may be generated between the estimated temperature curve T_EST CURVE and the real temperature curve T_REAL CURVE.

The temperature selector 348 may receive the extracted temperature T_EXT and the estimated temperature T_EST at the current point. As an non-limited example, when the memory device is vulnerable in low temperatures, the temperature selector 348 may determine a lower temperature between the extracted temperature T_EXT and the estimated temperature T_EST as the calibrated temperature T_CAL. According to operations of the temperature selector 348, the calibrated temperature curve T_CAL CURVE may form a curve to have a lower temperature value between the extracted temperature curve T_EXT CURVE and the estimated temperature curve T_EST CURVE.

For example, when the extracted temperature T_EXT goes below a predetermined threshold temperature, the temperature selector 348 may determine that the memory device may be in a circumstance vulnerable to low temperatures. In this case, the temperature selector 348 may determine a lower temperature between the extracted temperature T_EXT and the estimated temperature as the calibrated temperature T_CAL.

As described above, the memory device may be controlled based on a lower temperature among current estimated temperatures estimated by the extracted temperature at the current point and the past extracted temperatures, and thus, control reliability in actions of the memory device may be improved.

Figure 15A:
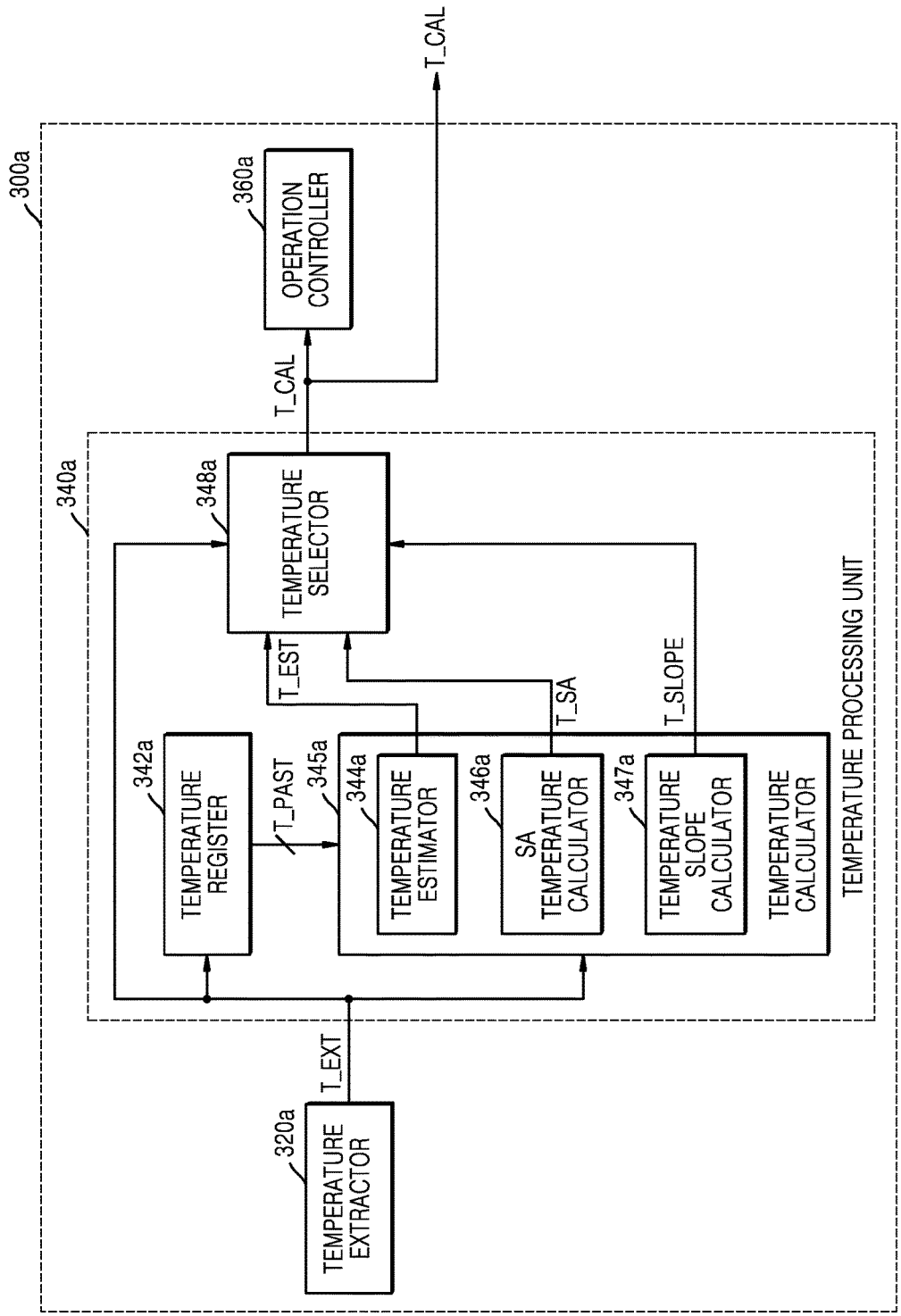
FIGS. 15A and 15B illustrate control logics according to exemplary embodiments of the present inventive concept.
Figure 15B:
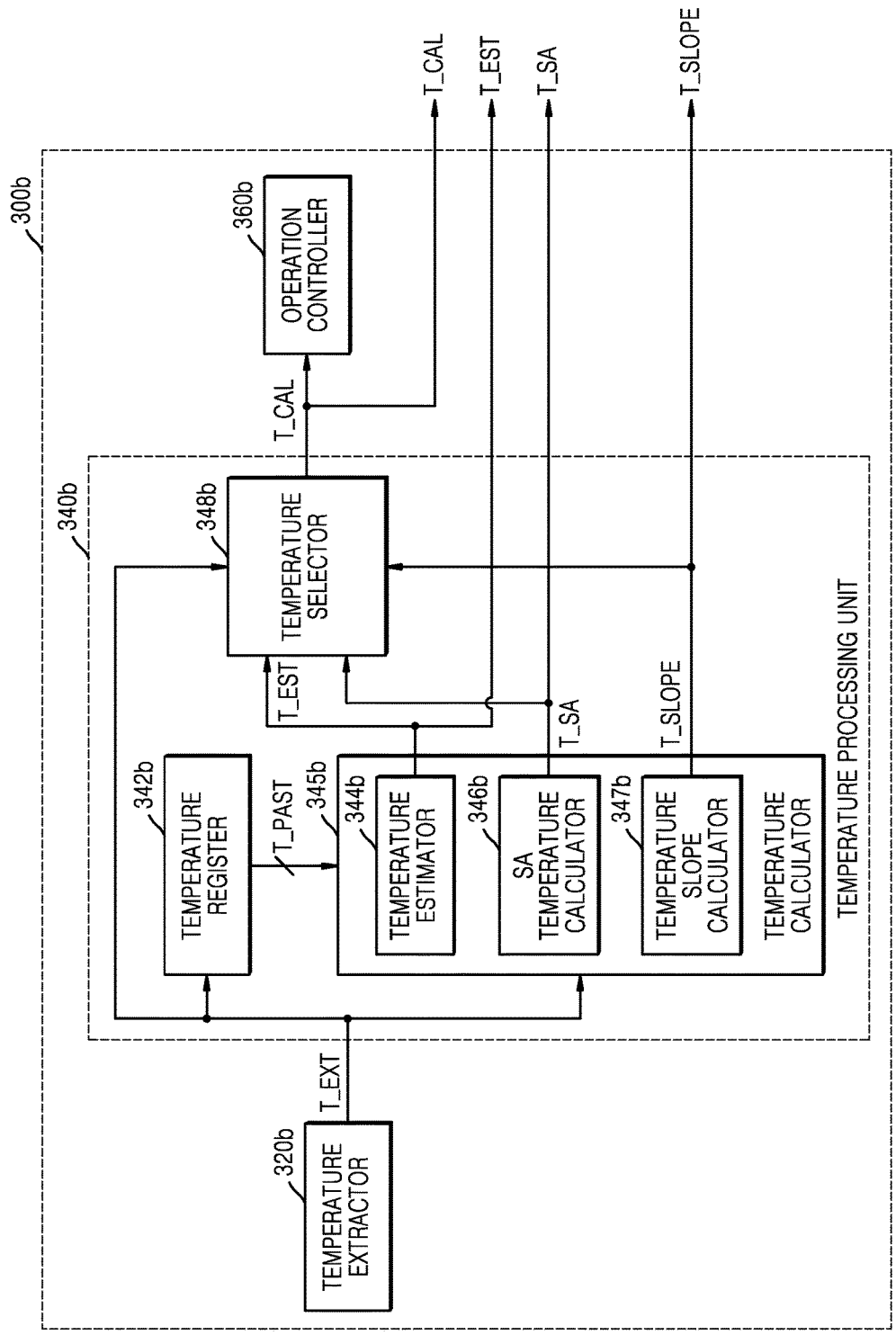

FIGS. 15A and 15B illustrate control logics according to exemplary embodiments of the present inventive concept. With respect to control logics 300a and 300b, descriptions overlapping with those of FIG. 4 are omitted.

Referring to FIG. 15A, the control logic 300a may include a temperature extractor 320a, a temperature processing unit 340a, and an operation controller 360a. The temperature processing unit 340a may include a temperature register 342a, a temperature calculator 345a, and a temperature selector 348a.

The temperature calculator 345a may receive the extracted temperature T_EXT from the temperature extractor 320a and receive the plurality of past extracted temperatures T_PAST from the temperature register 342a. Based on the extracted temperature T_EXT and the plurality of past extracted temperatures T_PAST, the temperature calculator 345a may calculate at least a piece of temperature information required to generate the calibrated temperature T_CAL. The at least a piece of temperature information may include the estimated temperature T_EST, a section average temperature T_SA, and a temperature gradient T_SLOPE. The temperature calculator 345a may include a temperature estimator 344a, a section average temperature calculator 346a, and a temperature gradient calculator 347a.

The temperature estimator 344a may generate the estimated temperature T_EST by using the extracted temperature T_EXT and the plurality of past extracted temperatures T_PAST. Descriptions about generation of the estimated temperature T_EST may be understood with reference to FIGS. 7A through 8B.

The section average temperature calculator 346a may generate the section average temperature T_SA by using the extracted temperature T_EXT and the plurality of past extracted temperatures T_PAST. Description about generation of the section average temperature T_SA may be understood with reference to FIG. 13.

The temperature gradient calculator 347a may generate a temperature gradient T_SLOPE by using the extracted temperature T_EXT and the plurality of past extracted temperatures T_PAST. The temperature gradient T_SLOPE may be a rate of change in a temporary calibrated temperature according to time which is a higher value between the extracted temperature T_EXT and the estimated temperature T_EST.

The temperature selector 348a may receive the estimated temperature T_EST, the section average temperature T_SA, and the temperature gradient T_SLOPE from the temperature calculator 345a, and may receive the extracted temperature T_EXT from the temperature extractor 320a. The temperature selector 348 may generate the calibrated temperature T_CAL by using the estimated temperature T_EST, the section average temperature T_SA, the temperature gradient T_SLOPE, and the extracted temperature T_EXT which are received.

Referring FIG. 15B, with respect to the control logic 300b, descriptions overlapping with those of FIG. 15A are omitted. The control logic 300b may include a temperature extractor 320b, a temperature processing unit 340b, and an operation controller 360b. The temperature processing unit 340b may include a temperature register 342b, a temperature calculator 345b, and a temperature selector 348b. The temperature calculator 345b may include a temperature estimator 344b, a section average temperature calculator 346b, and a temperature gradient calculator 347b.

The estimated temperature T_EST, the section average temperature T_SA, and the temperature gradient T_SLOPE generated by the temperature calculator 345b may be transmitted to the outside of the memory device. For example, the temperature calculator 345b may transmit the estimated temperature T_EST, the section average temperature T_SA, and the temperature gradient T_SLOPE to a memory controller on the outside of the memory device.

Referring to FIGS. 15A and 15B, the memory device may control operations of the memory device by using the calibrated temperature T_CAL, which is processed with reference to information regarding not only the extracted temperature T_EXT but also the estimated temperature T_EST, the section average temperature T_SA, and the temperature gradient T_SLOPE, and accordingly, operation reliability of the memory device may be improved.

Figure 16:
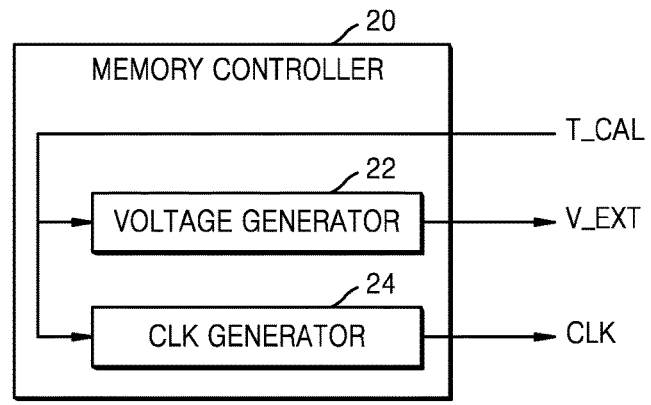
FIG. 16 illustrates a memory controller according to an exemplary embodiment of the present inventive concept.

FIG. 16 illustrates a memory controller according to an exemplary embodiment of the present inventive concept.

A memory controller 20 may receive the calibrated temperature T_CAL, which is a temperature generated by sensing a temperature, extracting the sensed temperature, and processing information regarding the temperature that is sensed and extracted. The memory controller 20 may control operations of the memory device based on the calibrated temperature T_CAL. To this end, the memory controller 20 may include a voltage generator 22 and a clock generator 24.

The voltage generator 22 may generate different external voltages V_EXT depending on the calibrated temperature T_CAL. For example, the voltage generator 22 may generate lower external voltages V_EXT as the calibrated temperature T_CAL increases.

The clock generator 24 may generate clock signals with different frequencies depending on the calibrated temperature T_CAL. For example, the clock generator 24 may generate the clock signal CLK with a lower frequency as the calibrated temperature T_CAL increases.

Controlling the external voltage V_EXT and generation of the clock signal CLK is merely an example of control actions, and the control actions of the memory controller 20 are not limited thereto. The calibrated temperature T_CAL received from the memory device may be used for various control actions of the memory device.

Figure 17:
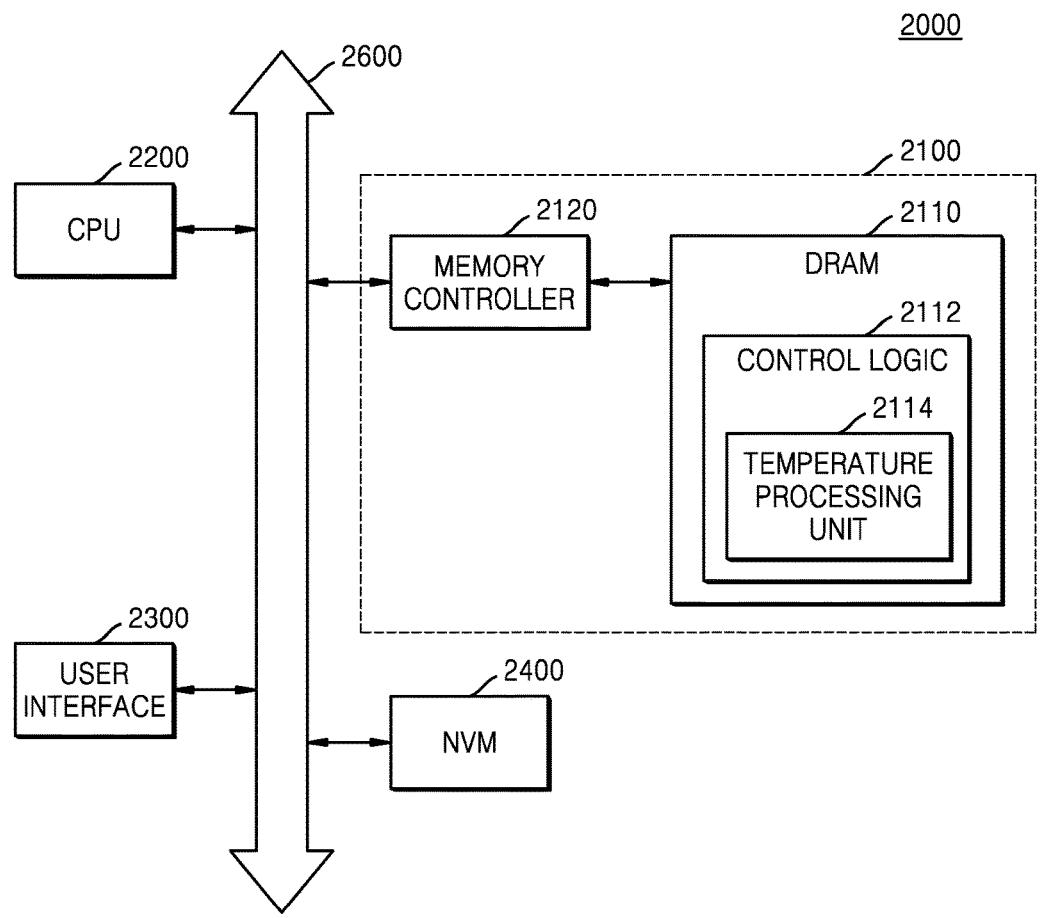
FIG. 17 illustrates a computing system according to an exemplary embodiment of the present inventive concept.

FIG. 17 illustrates a computing system according to an exemplary embodiment of the present inventive concept. A computing system 2000 may include a memory system 2100 electrically connected to a system bus 2600, a central processing unit (CPU) 2200, a user interface 2300, and a nonvolatile memory device 2400. The memory system 2100, the CPU 2200, the user interface 2300, and the nonvolatile memory device 2400 may communicate via the system bus 2600. The computing system 2000 may further include ports which may communicate with a video card, a sound card, a memory card, a USB device, or other electronic devices. The computing system 2000 may be implemented as a personal computer, or as a mobile electronic device such as a notebook computer, a mobile phone, a personal digital assistant (PDA), a camera, or the like.

The CPU 2200 may perform particular calculations or tasks. For example, the CPU 2200 may be a micro-processor, a graphics processing unit (GPU), etc. The CPU 2200 may also be connected to an expansion bus such as a peripheral component interconnect (PCI) bus.

The user interface 2300 may include input devices such as a keyboard, a keypad, or a mouse to receive an input signal from a user, and may also include output devices such as a printer or a display device to provide an output signal to the user.

The nonvolatile memory device 2400, for example, may include a nonvolatile semiconductor memory device such as an electrically erasable programmable read-only memory (EEPROM), a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The memory system 2100 may include a memory controller 2120 and a DRAM device 2110. The DRAM device 2110 may include a control logic 2112, and the control logic 2112 may include a temperature processing unit 2114. As described above, the temperature processing unit 2114 may store an extracted temperature, which is generated by sensing a temperature and extracting the sensed temperature by the DRAM device 2110, and may also calculate an estimated temperature at a current point by using past extracted temperatures and the extracted temperature of the current point. Additionally, the temperature processing unit 2114 may calculate a section average temperature. The temperature processing unit 2114 may determine a calibrated temperature by using pieces of information regarding the extracted temperature, the estimated temperature, the section average temperature, and a temperature gradient. The DRAM device 2110 may control operations thereof based on the calibrated temperature. The memory controller 2120 may also receive the calibrated temperature, and may control the DRAM device 2110 based on the received calibrated temperature. Because the operations of the DRAM device 2110 are controlled based not on a temperature extracted at the current point but on the calibrated temperature, which is generated by processing the extracted temperature, operation reliability of the device may be improved.

While the present inventive concept has been particularly shown and described with reference to exemplary embodiments thereof, it will be understood by those of ordinary skill in the art that various changes in form and details may be made thereto without departing from the spirit and scope of the present inventive concept as set forth by the following claims.

What is claimed is:

1. A method of controlling a memory device comprising a temperature sensor, the method comprising:
   sensing a temperature of the memory device, and extracting an extracted temperature for controlling the memory device using the sensed temperature;
   storing the extracted temperature in the memory device;
   calculating an estimated temperature at a current time point using the extracted temperature and a plurality of past extracted temperatures stored in the memory device; and
   controlling the memory device using the estimated temperature,
   wherein calculating estimated temperature comprises:
   calibrating the extracted temperature and the plurality of past extracted temperatures by an extraction delay time that is consumed from the sensing of the temperature of the extracting of the extracted temperature.

2. The method of claim 1, wherein calculating the estimated temperature further comprises:
   determining the estimated temperature using the calibrated extracted temperature and the calibrated plurality of past extracted temperatures.

3. The method of claim 2, wherein determining the estimated temperature comprises:
   determining a tendency according to time in the calibrated extracted temperature and the calibrated plurality of past extracted temperatures; and
   calculating the estimated temperature corresponding to the current time point according to the determined tendency.

4. The method of claim 3, wherein determining the tendency comprises:
   using a tendency line according to time of the calibrated extracted temperature and the calibrated plurality of past extracted temperatures.

5. The method of claim 1, wherein controlling the memory device comprises:
   determining a higher temperature between the extracted temperature and the estimated temperature as a calibrated temperature and controlling the memory device using the calibrated temperature.

6. The method of claim 5, wherein in the controlling of the memory device,
   when a change rate of the calibrated temperature according to time is higher than a threshold change rate, the change rate in the calibrated temperature is limited to the threshold change rate.

7. The method of claim 1, wherein in the controlling of the memory device,
   when the extracted temperature is lower than a predetermined critical temperature, a lower temperature between the extracted temperature and the estimated temperature is determined as a calibrated temperature, and the memory device is controlled using the calibrated temperature.

8. The method of claim 1, further comprising:
   calculating a section average temperature using the extracted temperature and the plurality of past extracted temperatures,
   wherein the memory device is controlled using the extracted temperature, the estimated temperature, and the section average temperature.

9. The method of claim 1, further comprising:
   generating a calibrated temperature for the controlling of the memory device, using the extracted temperature and the estimated temperature; and
   outputting the calibrated temperature to an outside of the memory device.

10. The method of claim 1, wherein controlling the memory device comprises controlling a refresh cycle of the memory device using the estimated temperature.

11. A memory device, comprising:
    at least one memory cell array;
    a temperature sensor configured to sense a temperature of the memory device;
    a control logic circuit configured to receive the sensed temperature from the temperature sensor, generate an extracted temperature of the memory device using the sensed temperature, generate a calibrated temperature by calibrating the extracted temperature and a plurality of past extracted temperatures along a time axis and determining a tendency according to time in the calibrated extracted temperature and the calibrated plurality of past extracted temperatures, and control operations of the at least one memory cell array using the calibrated temperature; and
    a register configured to store the extracted temperature and the plurality of past extracted temperatures and provide the plurality of past extracted temperatures stored in the temperature register to the control logic circuit.

12. The memory device of claim 11, wherein the control logic circuit comprises:
    a temperature extractor configured to receive the sensed temperature and generate the extracted temperature using the sensed temperature;
    a temperature processing unit configured to generate the calibrated temperature using the extracted temperature and the plurality of past extracted temperatures; and
    an operation controller configured to control operations of the at least one memory cell array using the calibrated temperature,
    wherein the temperature processing unit comprises a temperature calculator configured to calculate at least one piece of temperature information for generating the calibrated temperature using the extracted temperature and the plurality of past extracted temperatures.

13. The memory device of claim 12, wherein the temperature calculator comprises:
    a temperature estimator configured to calibrate a time axis in a negative time direction by an extraction delay time with respect to the extracted temperature and the plurality of past extracted temperatures, and calculate an estimated temperature at a current time point using the extracted temperature and the plurality of past extracted temperatures having the calibrated time axis.

14. The memory device of claim 12, wherein the temperature calculator comprises:

a section average temperature calculator configured to calculate a section average temperature based on the extracted temperature and the plurality of past extracted temperatures.

15. The memory device of claim 12, wherein the temperature calculator generates a first rate of change in temperatures using the extracted temperature and the plurality of past extracted temperatures, and
the temperature processing unit further comprises;
a temperature selector configured to generate the calibrated temperature having a rate of change substantially identical to a threshold change rate when the first rate of change in temperatures is greater than the threshold change rate.

16. The memory device of claim 12, wherein
the temperature processing unit determines a higher temperature between the extracted temperature and the at least one piece of temperature information as the calibrated temperature.

17. A method of determining a temperature of a memory device, the method comprising:
sensing, by at least one temperature sensor, a temperature of the memory device;
extracting the temperature of the memory device using the sensed temperature;
generating an estimated temperature at a current time point using the extracted temperature and a plurality of past extracted temperatures stored in the memory device; and
determining a calibrated temperature of the memory device using the estimated temperature and the extracted temperature,
wherein when the extracted temperature and the estimated temperature over a period of time are plotted in a graph as a plurality of extracted temperatures and a plurality of estimated temperatures, the plurality of extracted temperatures represent a curve that is substantially parallel and shifted in a positive time direction by an extraction delay time on a time axis with respect to a plurality of real temperatures of the memory device, and the plurality of estimated temperatures represent a curve that is closer to the plurality of real temperatures than the plurality of extracted temperatures.

18. The method of claim 17, wherein
determining the calibrated temperature comprises:
determining a higher temperature between the estimated temperature and the extracted temperature as the calibrated temperature.

19. The method of claim 17, wherein in the determining of the calibrated temperature,
when a change rate of the calibrated temperature according to time is higher than a threshold change rate, the change rate of the calibrated temperature is limited to the threshold change rate.

20. The method of claim 17, wherein a refresh cycle of the memory device is controlled to be shorter as the calibrated temperature increases.

* * * * *